(12) United States Patent
Fujii

(10) Patent No.: US 9,196,644 B2
(45) Date of Patent: Nov. 24, 2015

(54) IMAGING DEVICE FOR PHASE DIFFERENCE DETECTION FOR FOCUSING AND IMAGE GENERATION

(75) Inventor: Shinichi Fujii, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 43 days.

(21) Appl. No.: 13/811,684

(22) PCT Filed: Jul. 7, 2011

(86) PCT No.: PCT/JP2011/065561
§ 371 (c)(1),
(2), (4) Date: Jan. 23, 2013

(87) PCT Pub. No.: WO2012/023355
PCT Pub. Date: Feb. 23, 2012

(65) Prior Publication Data
US 2013/0120644 A1 May 16, 2013

(30) Foreign Application Priority Data
Aug. 16, 2010 (JP) ................. 2010-181486

(51) Int. Cl.
*H04N 5/232* (2006.01)
*H04N 5/225* (2006.01)
(Continued)

(52) U.S. Cl.
CPC ............ *H01L 27/14601* (2013.01); *G02B 7/36* (2013.01); *G03B 13/36* (2013.01);
(Continued)

(58) Field of Classification Search
CPC . H04N 5/23212; H04N 9/045; H04N 5/2258; H04N 5/3696; H04N 5/37457; H01L 27/14601; G03B 19/12; G03B 13/36; G02B 7/36

USPC ........................ 348/349, 354, 345, 273, 315
See application file for complete search history.

(56) References Cited

U.S. PATENT DOCUMENTS

2009/0225217 A1* 9/2009 Katsuda et al. ............... 348/366
2010/0073527 A1 3/2010 Ichimiya
(Continued)

FOREIGN PATENT DOCUMENTS

JP 2003156677 A 5/2003
JP 2009-145401 A 7/2009
(Continued)

OTHER PUBLICATIONS

International Search Report Issued Oct. 18, 2011 in PCT/JP2011/065561.

*Primary Examiner* — Nhan T Tran
(74) *Attorney, Agent, or Firm* — Hazuki International, LLC

(57) ABSTRACT

In a second image sensor 200 which has a plurality of phase difference detection pixels which generate signals for performing adjusted focus decision by way of phase difference detection and a plurality of image generation pixels which generate signals for generating images, a first pixel group which is formed by arranging part of phase difference detection pixels of the plurality of phase difference detection pixels in a specific direction, and a second pixel group which is formed by arranging part of image generation pixels of the plurality of image generation pixels in the specific direction are alternately arranged in an orthogonal direction orthogonal to the specific direction. Consequently, when an image capture element used to detect a phase difference and generate an image generates an image, it is possible to reduce a load of processing related to image generation.

13 Claims, 14 Drawing Sheets

(51) Int. Cl.
*H01L 27/14* (2006.01)
*G02B 7/36* (2006.01)
*H04N 5/369* (2011.01)
*H01L 27/146* (2006.01)
*H04N 9/04* (2006.01)
*G03B 13/36* (2006.01)
*G03B 19/12* (2006.01)
*H04N 5/3745* (2011.01)

(52) U.S. Cl.
CPC ............. *G03B 19/12* (2013.01); *H04N 5/2258* (2013.01); *H04N 5/23212* (2013.01); *H04N 5/3696* (2013.01); *H04N 9/045* (2013.01); *H04N 5/37457* (2013.01)

(56) References Cited

U.S. PATENT DOCUMENTS

| | | | |
|---|---|---|---|
| 2010/0253799 A1* | 10/2010 | Mabuchi | 348/273 |
| 2010/0309351 A1* | 12/2010 | Smith et al. | 348/280 |
| 2011/0025904 A1* | 2/2011 | Onuki et al. | 348/360 |
| 2011/0063484 A1* | 3/2011 | Fujii et al. | 348/294 |

FOREIGN PATENT DOCUMENTS

| | | |
|---|---|---|
| JP | 2009-162847 A | 7/2009 |
| JP | 2009-204964 A | 9/2009 |
| JP | 2010078856 | 4/2010 |

\* cited by examiner (a)

(b)

(a)

(b)

PUPIL DIVISION LINE OF PHASE
DIFFERENCE DETECTION PIXELS D1c AND D1d (a)

PUPIL DIVISION LINE OF PHASE
DIFFERENCE DETECTION PIXELS D2c AND D2d (b)

PUPIL DIVISION LINE OF PHASE
DIFFERENCE DETECTION PIXELS D3c AND D3d (a)

PUPIL DIVISION LINE OF PHASE
DIFFERENCE DETECTION PIXELS D4c AND D4d (b)

HORIZONTAL D1 ROW 731
HORIZONTAL D2 ROW 732
HORIZONTAL D3 ROW 733
HORIZONTAL D4 ROW 734
HORIZONTAL D5 ROW 735
HORIZONTAL D6 ROW 736
HORIZONTAL D7 ROW 737
HORIZONTAL D8 ROW 738

IMAGING DEVICE FOR PHASE DIFFERENCE DETECTION FOR FOCUSING AND IMAGE GENERATION

TECHNICAL FIELD

The present invention relates to an image capture element, and, more particularly, relates to an image capture element which detects a phase difference and captures images and an imaging device.

BACKGROUND ART

In recent years, imaging devices such as digital still cameras which capture images of subjects such as people, generate captured images and record these generated captured images have been spreading. Further, as such imaging devices, imaging devices which have auto-focus (AF) functions of automatically adjusting focus (focal point) upon image capturing to facilitate users' image capturing operations are widely spreading.

As such imaging devices, imaging devices which form a pair of images by pupil-dividing light having passed an image capture lens, and measure an interval between the formed images (detect a phase difference) to determine a position of the image capture lens (see, for example, Patent Document 1). This imaging device forms a pair of images by providing in an image sensor adjusted focus detection pixels which perform pupil division by blocking half of subject light received by a light reception element, and calculate an amount of misalignment of focus by measuring an interval between the formed images. Further, this imaging device adjusts focus by calculating the amount of movement of the image capture lens based on the calculated amount of misalignment of focus, and adjusting the position of the image capture lens based on the calculated amount of movement (focus adjustment).

CITATION LIST

Patent Document

Patent Document 1: Japanese Patent Application Laid-Open No. 2009-145401 (FIG. 15)

SUMMARY OF THE INVENTION

Problems to be Solved by the Invention

According to the above conventional technique, both pixels of phase difference detection (adjusted focus detection pixels (phase difference detection pixels) and captured image generation pixels (image generation pixels) are provided in one image sensor, and therefore it is not necessary to provide two sensors of the adjusted focus detection sensor and the captured image sensor separately.

However, according to the above conventional technique, the phase difference detection pixels cannot generate a signal and therefore it is necessary to predict (supplement) data at a position of a phase difference detection pixel from data of a close image generation pixel by regarding the position of the phase difference detection pixel as a defective pixel. Further, an image generation pixel neighbor to the phase difference detection pixel has a different property from the image generation pixel neighbor only to the image generation pixel, and needs perform correction upon generation of an image. This results in requiring image processing of generating images corresponding to phase difference detection pixels and images corresponding to image generation pixels close to the phase difference detection pixels, thereby increasing a load of this image processing.

The present invention is made in light of such a situation, and an object of the present invention is to reduce a load of processing related to image generation when an image capture element used to detect a phase difference and generate an image generates an image.

Solutions to Problems

The present invention is made to solve the above problem, and a first aspect of the present invention has: a plurality of phase difference detection pixels which generate signals for performing adjusted focus decision by way of phase difference detection; and a plurality of image generation pixels which generate signals for generating an image, and a first pixel group formed by arranging part of phase difference detection pixels of the plurality of phase difference detection pixels in a specific direction and a second pixel group formed by arranging part of image generation pixels of the plurality of pixel generation pixels in the specific direction are alternately arranged in an orthogonal direction orthogonal to the specific direction. By this means, an effect is provided that the first pixel group formed by arranging the phase difference detection pixels in the specific direction and the second pixel group formed by arranging the image generation pixels are alternately arranged.

Further, according to this first aspect, each of the plurality of image generation pixels may have a fixed ratio of the phase difference detection pixels and the image generation pixels for each neighboring pixel in an area of the image capture element which receives subject light. By this means, an effect is provided that a rate of the phase difference detection pixels and the image generation pixels is fixed for each pixel neighbor to the image generation pixels.

Further, according to this first aspect, the first pixel group may have a plurality of phase difference detection pixels forming one or a plurality of lines, and the second pixel group may have a plurality of image generation pixels forming one or two lines. By this means, an effect is provided that the first pixel group has a plurality of phase difference detection pixels forming one or a plurality of lines and the second pixel group has a plurality of image generation pixels forming one or two lines.

Further, according to this first aspect, the specific direction may a reading direction when data generated by the phase difference detection pixels and the image generation pixels is read from the phase difference detection pixels and the image generation pixels. By this means, an effect is provided that the first pixel group formed by arranging the phase difference detection pixels in the reading direction and the second pixel group formed by arranging the image generation pixels in the reading direction are alternately arranged.

Further, according to this first aspect, the first pixel group may have a plurality of phase difference detection pixels forming one line, the second pixel group may have a plurality of image generation pixels forming one line, and two continuous image generation pixels of the plurality of image generation pixels which have color filters of an identical property and are arranged in the specific direction may form a pair of image generation pixels, and each pixel may be arranged using the pair of image generation pixels as pixel units. By this means, an effect is provided that the two continuous image generation pixels which have color filters of the identical property and are arranged in the specific direction form a pair of image generation pixels, and each pixel is arranged using the pair of image generation pixels as pixel units. Further, in this case, the plurality of image generation pixels may be arranged in Bayer alignment in the pixel units in the image capture element. By this means, an effect is provided that the pixel units of the image generation pixels are arranged in Bayer alignment.

Further, according to this first aspect, two phase difference detection pixels of the plurality of phase difference detection pixels which perform pupil division in an identical direction and receive lights divided in one way of the identical direction may form a pair of phase difference detection pixels as two continuous phase difference detection pixels arranged in the specific direction, and each pixel may be arranged using the pair of the phase difference detection pixels as pixel units. By this means, an effect is provided that the two continuous phase difference detection pixels arranged in the specific direction form a pair of phase difference detection pixels, and each pixel is arranged using the pair of phase difference detection pixels as pixel units.

Further, according to this first aspect, two continuous light reception elements of light reception elements of the plurality of image generation pixels which have color filters of an identical property and which are arranged in the specific direction may form a pair of light reception elements, and each pixel may be arranged using two pixels related to the pair of light reception elements as pixel units. By this means, an effect is provided that the two light reception elements are provided to the image generation pixel as a pair of light reception element.

Further, according to this first aspect, two light reception elements of light reception elements of the plurality of phase difference detection pixels which perform pupil division in an identical direction and receive light divided in one way of the identical direction may form a pair of light reception elements, and each element may be arranged using two pixels related to the pair of light reception elements as a pixel unit. By this means, an effect is provided that the two light reception elements are provided to the phase difference detection pixel as a pair of light reception elements.

Further, according to this first aspect, the first pixel group may have a first line formed by arranging in the specific direction the phase difference detection pixels to be pupil-divided in the specific direction and a second line formed by arranging in the specific direction the phase difference detection pixels to be pupil-divided in the orthogonal direction, and the first line and the second line may be alternately arranged across the second pixel group. By this means, an effect is provided that the first line of the phase difference detection pixels to be pupil-divided in the specific direction and the second line of the phase difference detection pixels to be pupil-divided in the orthogonal direction are alternately arranged across the second pixel group. Further, in this case, the phase difference detection pixel may have a plurality of phase difference detection pixels corresponding to a plurality of exit pupils provided at different positions in an optical axis direction, and the first line may be formed by arranging phase difference detection pixels of the plurality of phase difference detection pixels having the exit pupils provided at an identical position. By this means, an effect is provided that the first line is formed by arranging the phase difference detection pixels of a plurality of phase difference detection pixels having the exit pupils provided at the identical position. Further, in this case, the plurality of phase difference detection pixels may have a plurality of phase difference detection pixels corresponding to a plurality of exit pupils provided at different positions in an axial direction, and the second line may be formed by arranging phase difference detection pixels having the exit pupils provided at an identical position, at a position identical to a position in the specific direction. By this means, an effect is provided that the second line is formed such that the phase difference detection pixels having the pupil exists provided at the identical position are provided at the same position as the position in the specific direction.

Further, according to a second aspect of the present invention, an image capture element has: a plurality of phase difference detection pixels which generate signals for performing adjusted focus decision by way of phase difference detection; and a plurality of image generation pixels which generate signals for generating an image, and each of the plurality of image generation pixels has a fixed ratio of the phase difference detection pixels and the image generation pixels for each neighboring pixel in an area of the image capture element which receives subject light. By this means, an effect is provided that a rate of the phase difference detection pixels and the image generation pixels is fixed for each pixel neighbor to the image generation pixels.

Further, according to a third aspect of the present invention, an imaging device has: an image capture element which has a plurality of phase difference detection pixels which generate signals for performing adjusted focus decision by way of phase difference detection, and a plurality of image generation pixels which generate signals for generating an image, and in which a first pixel group formed by arranging part of phase difference detection pixels of the plurality of phase difference detection pixels in a specific direction and a second pixel group formed by arranging part of image generation pixels of the plurality of pixel generation pixels in the specific direction are alternately arranged in an orthogonal direction orthogonal to the specific direction; an focus adjustment decision unit which performs adjusted focus decision by way of phase difference detection based on the signals generated by the phase difference detection pixels; and an image generation unit which generates an image based on the signals generated by the image generation pixels. By this means, an effect is provided that adjusted focus is performed by way of phase difference detection and image generation is performed by using the image capture element in which the first pixel group formed by arranging the phase difference detection pixels in the specific direction and the second pixel group formed by forming the image generation pixels in the specific group are alternately arranged.

Effects of the Invention

The present invention can provide a good effect of reducing a load of processing related to image generation when an image capture element used to detect a phase difference and generate an image generates an image.

BRIEF DESCRIPTION OF DRAWINGS

FIG. 12 is a view illustrating an arrangement of light reception elements of the second image sensor in which only phase difference detection pixels to be pupil-divided in a reading direction are arranged in a row of the phase difference detection pixels according to the modified example of the first embodiment of the present invention.

MODE FOR CARRYING OUT THE INVENTION

Hereinafter, a mode (hereinafter, "embodiment") for implementing the present invention will be described. The embodiment will be described in the following order.

1. First Embodiment (Image capture control: an example where lines of phase difference detecting pixels and lines of image generating pixels are alternately arranged)

2. Modified Example

<1. First Embodiment>

[Example of Function and Configuration of Imaging Device]

Figure 1:
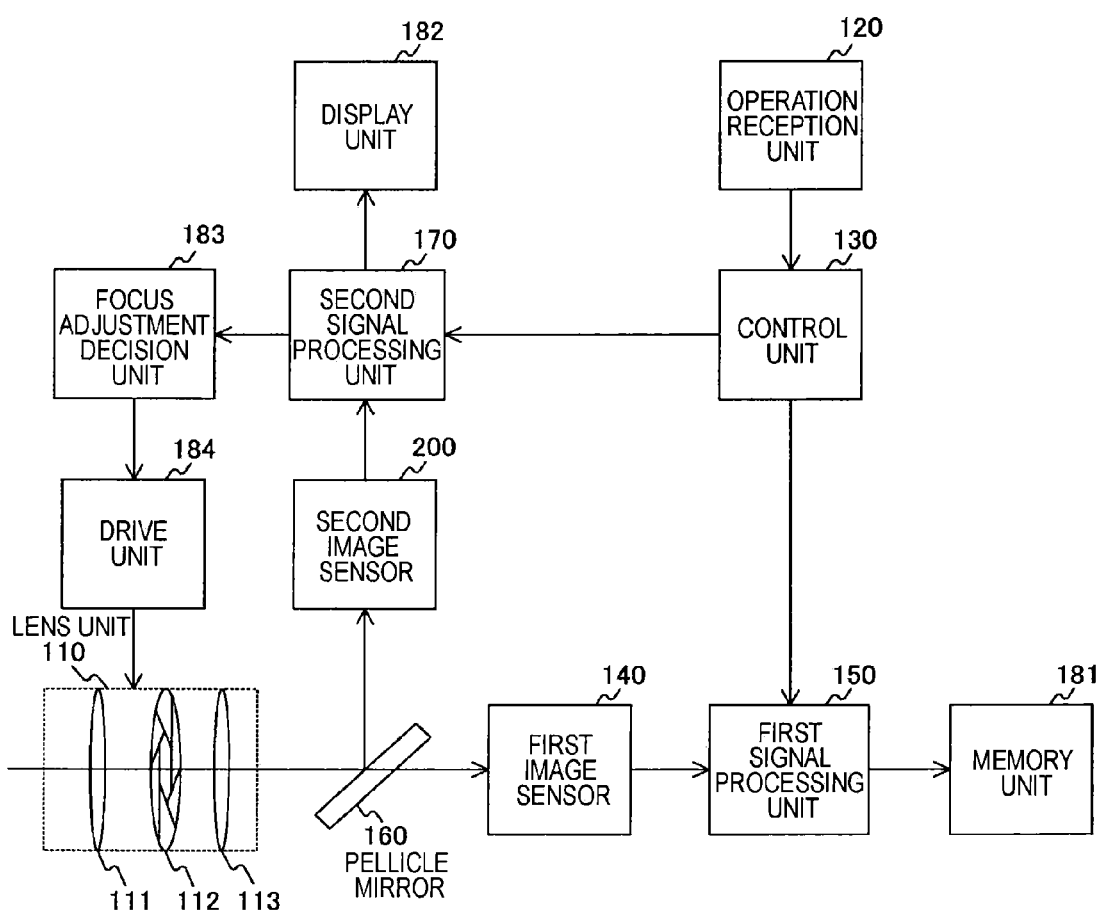
FIG. 1 is a block diagram illustrating an example of a function and a configuration of an imaging device 100 according to a first embodiment of the present invention.

FIG. 1 is a block diagram illustrating an example of a function and a configuration of an imaging device 100 according to a first embodiment of the present invention. The imaging device 100 is an imaging device which captures an image of a subject, generates image data (captured image) and records the generated image data as image content (still image content or movie content). In addition, an example will be mainly described below where still image content (still image file) is recorded as image content (image file).

The imaging device 100 has a lens unit 110, an operation reception unit 120, a control unit 130, a first image sensor 140 and a first signal processing unit 150. Further, the imaging device 100 has a pellicle mirror 160, a second image sensor 200, a second signal processing unit 170, a memory unit 181, a display unit 182, an focus adjustment decision unit 183 and a drive unit 184.

The lens unit 110 condenses light (subject light) from a subject. This lens unit 110 has a zoom lens 111, a diaphragm 112 and a focus lens 113.

The zoom lens 111 adjusts the magnification power of the subject included in a captured image by changing a focal distance while being driven by the drive unit 184 and moved in the optical direction.

The diaphragm 112 is a blocking material for adjusting the amount of subject light incident on the first image sensor 140 and the second image sensor 200 by changing the degree of aperture while being driven by the drive unit 184.

The focus lens 113 adjusts the focus by moving in the optical direction while being driven by the drive unit 184.

The operation reception unit 120 receives an operation from a user. When, for example, a shutter button 121 (illustrated in FIG. 2) is pushed, this operation reception unit 120 supplies a signal related to this pushing to the control unit 130 as an operation signal.

The control unit 130 controls the operation of each unit in the imaging device 100. For example, when receiving an operation signal for starting recording a still image in response to pushing of the shutter button 121, this control unit 130 supplies a signal related to execution of recording of a still image (still image capturing operation signal) to the first signal processing unit 150. Further, to display a live view on a display unit 182, the control unit 130 supplies a signal (live view display signal) for generating a live view image based on the signal outputted from the second image sensor 200 to the second signal processing unit 170. Meanwhile, the live view refers to real time display of an image of a subject incident on the imaging device 100. Further, when performing adjusted focus decision according to a phase difference detection system, the control unit 130 supplies a signal (phase difference detecting operation signal) indicating an operation (phase difference detecting operation) for performing this adjusted focus decision, to the second signal processing unit 170. Meanwhile, the phase difference detection system refers to a focus detection system which forms a pair of images by pupil-dividing light having passed an image capture lens, measuring an interval between the formed images (the amount of misalignment between the images (detecting the phase difference) and detecting the degree of focus adjustment.

The pellicle mirror 160 divides subject light condensed through the lens unit 110 into two. This pellicle mirror 160 is, for example, a semi-transparent mirror, and divides subject light into two by reflecting 30% of the subject light. The pellicle mirror 160 supplies one of the divided lights to the first image sensor 140, and supplies the other to the second image sensor 200.

The first image sensor 140 is an image capture element which receives one of the subject light divided by the pellicle mirror 160 and photoelectrically converts the received subject light into an electric signal. This first image sensor 140 is realized by, for example, a CMOS (Complementary Metal Oxide Semiconductor) sensor. In the first image sensor 140, only pixels (image generation pixels) which generate signals for generating a captured image based on the received subject light are arranged in Bayer alignment. The first image sensor 140 supplies the electric signal resulting from photoelectric conversion to the first signal processing unit 150.

The first signal processing unit 150 applies various signal processing to the electric signal supplied from the first image sensor 140. When, for example, receiving a supply of the still image capturing operation signal from the control unit 130, this first signal processing unit 150 generates data of a still image (still image data). Further, the first signal processing unit 150 supplies this generated image data to the memory unit 181 and has the memory unit 181 store this image data.

The memory unit 181 records image data supplied from the first signal processing unit 150 as image content (image file). For example, removable recording media (one or a plurality of recording media) such as disks including, for example, DVDs (Digital Versatile Disk) or semiconductor memories including, for example, memory cards can be used for this memory unit 181. Further, these recording media may be built in the imaging device 100 or may be detachable from the imaging device 100.

The second image sensor 200 is an image capture element which receives one of the subject light divided by the pellicle mirror 160 and photoelectrically converts the received subject light into an electric signal. This second image sensor 200 is realized by, for example, a CMOS sensor similar to the first image sensor 140. In the second image sensor 200, the image generation pixels and pixels (phase difference detection pixels) which generate signals for performing phase difference detection are arranged. In addition, the second image sensor 200 will be described with reference to FIGS. 3 to 10. The second image sensor 200 supplies the electric signal resulting from photoelectric conversion to the second signal processing unit 170. In addition, the second image sensor 200 is an example of the image capture element recited in the claims.

The second signal processing unit 170 applies various signal processing to the electric signal supplied from the second image sensor 200. When, for example, receiving a supply of the phase difference detection operation signal from the control unit 130, this signal processing unit 170 generates data (phase difference detection data) for detecting a phase difference based on output signals from the phase difference detection pixels in the second image sensor 200. Further, the second signal processing unit 170 supplies the generated phase difference detection data to the focus adjustment decision unit 183. Furthermore, when receiving a supply of a live view display signal from the control unit 130, the second signal processing unit 170 generates data of the live view image (live view image data) based on output signals from the image generation pixels in the second image sensor 200. Still further, the second signal processing unit 170 supplies this generated live view image data to the display unit 182, and has a display screen of the display unit 182 display the live view. In addition, the second signal processing unit 170 is an example of an image generation unit recited in the claims.

The display unit 182 displays an image based on the image data supplied from the second signal processing unit 170. This display unit 182 is realized by, for example, a color liquid crystal panel. When, for example, receiving a supply of the live view image data from the second signal processing unit 170, this display unit 182 displays the live view image on the display screen.

The focus adjustment decision unit 183 decides whether or not the focus is adjusted with respect to an object (focus adjustment target) which is a target to focus upon based on phase difference detection data supplied from the second signal processing unit 170. When the focus is adjusted on the object (focus adjustment target) in an area (focus area) in which focusing is performed, this focus adjustment decision unit 183 supplies information indicating that the focus is adjusted to the drive unit 184 as focus adjustment decision result information. Further, when the focus is not adjusted upon the focus adjustment target, this focus adjustment decision unit 183 calculates the amount of misalignment of focus (defocus amount) and supplies information indicating the calculated amount of defocus to the drive unit 184 as focus adjustment decision result information.

The drive unit 184 drives the zoom lens 111, the diaphragm 112 and the focus lens 113. For example, the drive unit 184 calculates the driving amount of the focus lens 113 based on the focus adjustment decision result information outputted from the focus adjustment decision unit 183 and moves the focus lens 113 according to the calculated driving amount. When the focus is adjusted, this drive unit 184 maintains the current position of the focus lens 113. Further, when the focus is defocused, the drive unit 184 calculates the driving amount (moving distance) based on the focus adjustment decision result information indicating the defocus amount and position information of the focus lens 113, and moves the focus lens 113 according to the driving amount.

[Example of Position of Pellicle Mirror]

Figure 2:
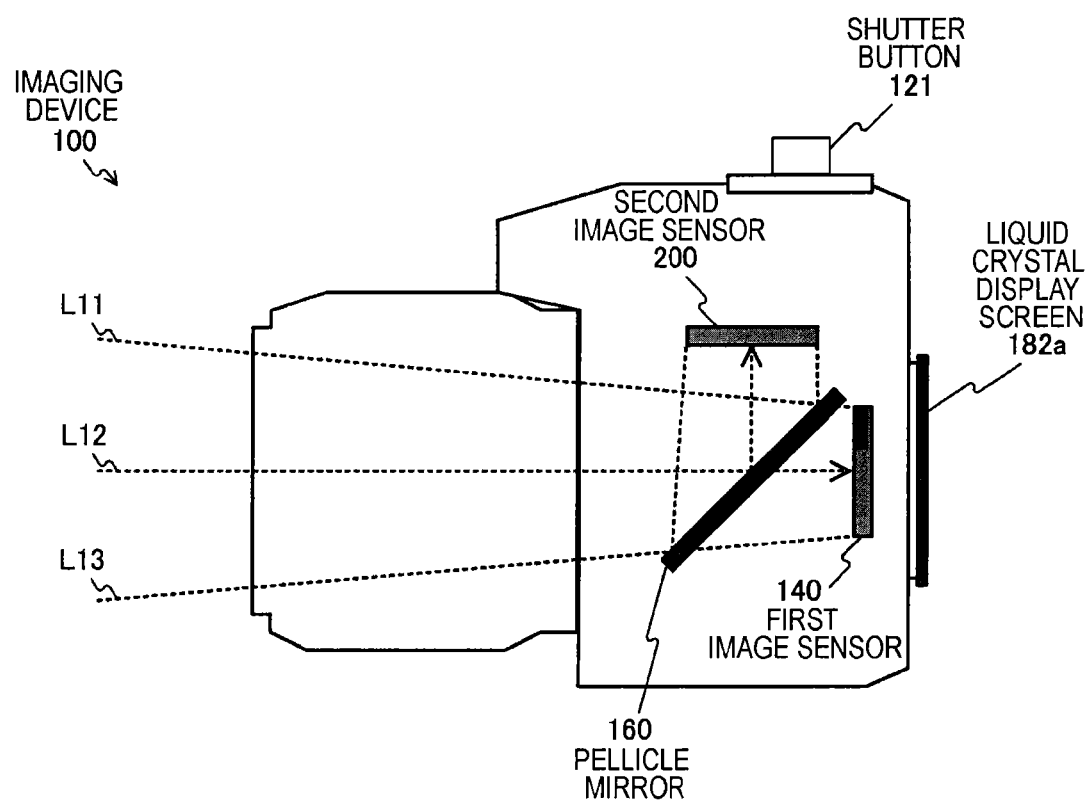
FIG. 2 is a cross-sectional view schematically illustrating an example of a position of a pellicle mirror 160 of the imaging device 100 according to the first embodiment of the present invention.

FIG. 2 is a cross-sectional view schematically illustrating an example of a position of the pellicle mirror 160 of the imaging device 100 according to the first embodiment of the present invention. In addition, the imaging device 100 will be described using FIG. 2 as a single-lens reflex camera.

In FIG. 2, the cross-sectional view of the imaging device 100 indicates the shutter button 121, the display screen (liquid crystal display 182a) of the display unit 182, the pellicle mirror 160, the first image sensor 140 and the second image sensor 200. Further, FIG. 2 illustrates an optical axis (optical axis L12) in a lens of the lens unit 110 and two lines (lines L11 and L13) indicating a range in which subject light passes. In addition, the range sandwiched by the lines L11 and L13 indicates a range in which lights incident on the first image sensor 140 and the second image sensor 200 pass.

The pellicle mirror 160 is arranged to divide subject light incident on the imaging device 100 into two. For example, the pellicle mirror 160 is arranged at 45 degrees with respect to the optical axis L12. By this means, the pellicle mirror 160 reflects part of subject light (for example, 30%) upward.

The first image sensor 140 is arranged vertically with respect to the optical axis L12 ahead of the pellicle mirror 160 (a traveling direction of subject light) to receive subject light having passed the pellicle mirror 160.

The second image sensor 200 is arranged horizontally with respect to the optical axis L12 above the pellicle mirror 160 (as the pellicle mirror 160 is at 45 degrees with respect to the optical axis L12) to receive the subject light reflected by the pellicle mirror 160.

By this means, in the imaging device 100, the pellicle mirror 160 is arranged to divide incident subject light into two. Further, the first image sensor 140 and the second image sensor 200 are arranged to receive the two divided subject lights.

[Example of Arrangement of Light Reception Elements of Second Image Sensor]

Figure 3:
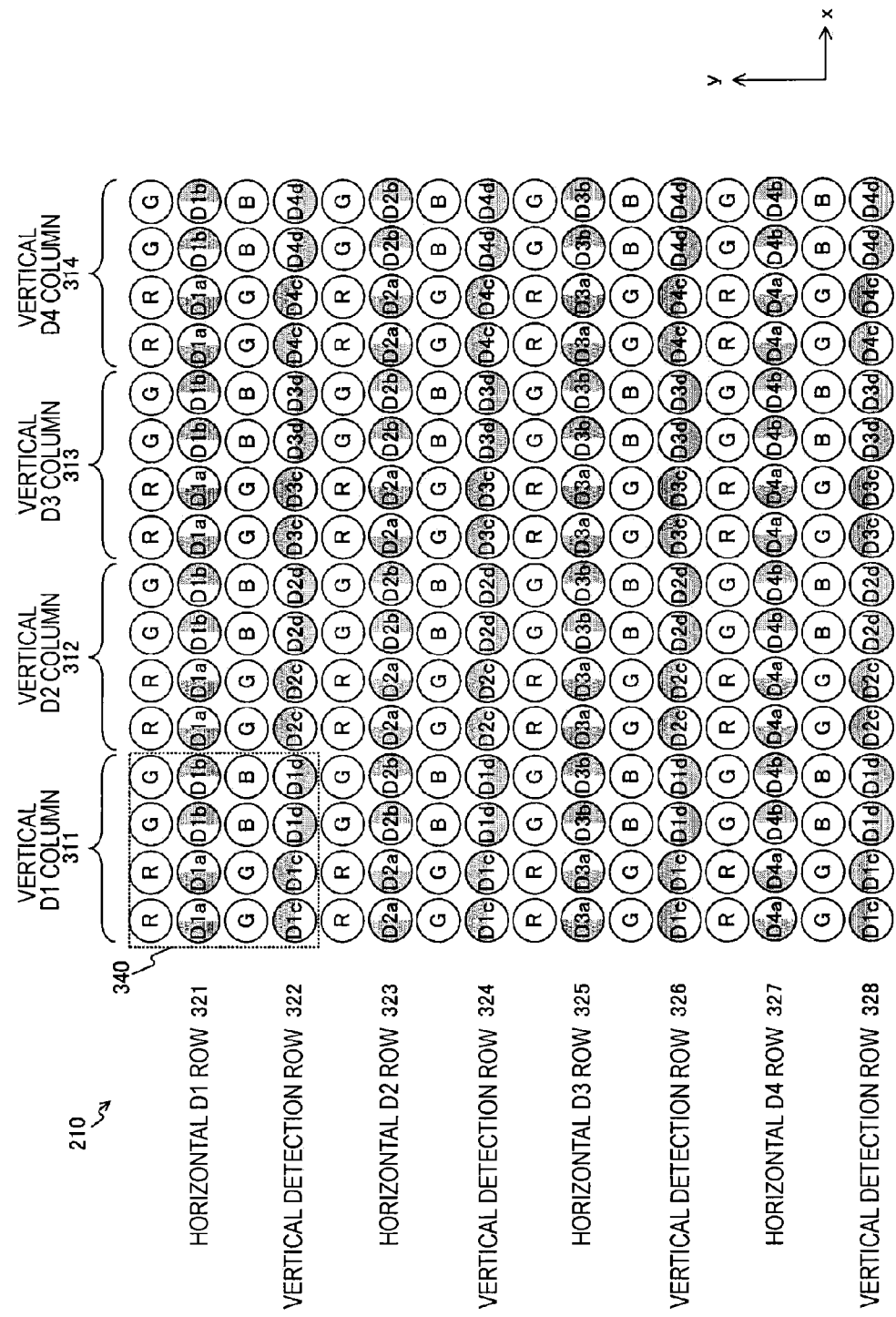
FIG. 3 is a schematic view illustrating an example of an arrangement of light reception elements of a second image sensor 200 according to the first embodiment of the present invention.

FIG. 3 is a schematic view illustrating an example of an arrangement of light reception elements of the second image sensor 200 according to the first embodiment of the present invention. According to the first embodiment of the present invention, one image generation pixel has two light reception elements, and one phase difference detection pixel also has two light reception elements. Hence, an arrangement of the light reception elements will be described with reference to FIG. 3.

In addition, FIG. 3 will be described assuming xy axes where left and right directions is a y axis and up and down directions are an x axis direction. Further, in FIG. 3, an upper left end is the original point of the xy axes, a direction from the top to the bottom is a + side of the x axis and a direction from the left to the right is a + side of the y axis. In addition, a reading direction of a signal in this second image sensor 200 is an x axis direction (read in row units). In addition, a reading direction of a signal in the second image sensor 200 is an example of a specific direction recited in the claims.

For ease of description, FIG. 3 will be described using an area (area 210) of part of light reception elements (light reception elements of sixteen rows and sixteen columns) of light reception elements of each pixel forming the second image sensor 200. In addition, according to an arrangement of the light reception elements in the second image sensor 200, a pixel arrangement (a pixel arrangement corresponding to the area 210) corresponding to this unit is repeated in the x direction and the y direction using the pixel arrangement indicated in the area 210 as one unit.

FIG. 3 illustrates one light reception element as one circle. Further, light reception elements of the image generation pixel are indicated by circles with references (R (red), G (green) and B (blue)) indicated therein and representing color filters provided in the light reception elements. Furthermore, light reception elements of the phase difference detection pixels are indicated by circles including portions including filled sides (gray semi-circles) which are the same as the side on which incident light is blocked by the light block unit. In addition, as to the light reception elements of the phase difference pixel, light reception elements corresponding to exit pupils of four positions (positions d1 to d4) are indicated together with reference numerals (D1 to D4). Further, alphabets (a to d) of the reference numerals of the light reception elements of the phase difference detection pixel indicate a side on which incident light is blocked by the light block unit (a is a − side of the x axis, b is the + side of the x axis, c is the + side of the y axis and d is the − side of the y axis). For example, D1a is a light reception element which blocks right half light of light pupil-divided to the left and right (the + and − sides of the x axis) by the exit pupil at the position d1 and receives the left half pupil-divided light. In addition, the phase difference detection pixel will be described with reference to FIGS. 4 to 8.

Hereinafter, an arrangement of pixels in the second image sensor 200 will be described.

In the second image sensor 200, rows (lines) in which light reception elements of image generation pixels are arranged and rows (lines) in which light reception pixels of phase difference detection pixels are arranged are alternately arranged. That is, as illustrated in FIG. 3, the image generation pixel, the phase difference detection pixel, the image generation pixel, the phase difference detection pixel and . . . are alternately arranged in the y axis direction. In addition, the rows in which the light reception elements of the image generation pixels are arranged are an example of a second image group recited in the claims. Further, the rows in which the light reception elements of the phase difference detection pixels are arranged are an example of a first pixel group recited in the claims.

Furthermore, the light reception elements of the image generation pixels are arranged such that two light reception elements in which color filters of the same color are arranged continue in the x axis direction (in FIG. 3, RR, GG and BB continue in the x axis direction). In addition, although these two continuous light reception elements form one image generation pixel with the first embodiment of the present invention, this will be described with reference to FIG. 6.

The light reception elements of the phase difference detection pixels are arranged such that two light reception pixels in which light is blocked on the identical side continue the x axis direction (in FIG. 3, for example, D1aD1a and D1bD1b continue in the x axis direction). In addition, although these two continuous light reception elements form one phase difference detection pixels with the first embodiment of the present invention, this will be described with reference to FIG. 6.

Further, the light reception elements of the phase difference detection pixels are arranged such that the rows in which only light reception elements in which a positional relationship between a light blocking side and a light incident side of subject light is the x axis direction (reading direction) are arranged and rows in which only the light reception elements in which a positional relationship between the light blocking side and the light incident side is the y axis direction are alternately arranged. That is, as for the light reception elements of phase difference detection pixels, phase difference detection pixels to be pupil-divided in the identical direction (a reading direction or a direction orthogonal to the reading direction) are arranged in row units. In FIG. 3, horizontal D1 row 321, horizontal D2 row 323, horizontal D3 row 325 and horizontal D4 row 327 are indicated as rows in which only light reception elements in the x axis direction are arranged. Further, a vertical detection row 322, a vertical detection row 324, a vertical detection row 326 and a vertical detection row 328 are indicated as rows in which only light reception elements in the y axis direction are arranged.

In the rows in which only the light reception elements in the x axis direction are arranged, the light reception elements having exit pupils provided at the same position are arranged. That is, only D1a and D1b are arranged in horizontal D1 row 321, only D2a and D2b are arranged in horizontal D2 row 323, only D3a and D3b are arranged in horizontal D row 325 and only D4a and D4b are arranged in horizontal D4 row 327. Further, in the rows in which only light reception elements in the x axis direction are arranged, phase difference detection pixels of light reception elements a (which are in the x axis direction and on the − side of which light is blocked) and phase difference detection pixels of light reception elements b (which are in the x axis direction and on the + side of which light is blocked) are alternately arranged. For example, in horizontal D1 row 321 in FIG. 3, the two light reception elements D1bD1b are neighbor to the two light reception elements D1aD1a (the two light reception elements form one phase difference detection pixel, and therefore the phase difference detection pixel D1a is neighbor to the phase difference detection pixel D1b). That is, the light reception elements (light reception elements of a and b types) to be pupil-divided in the reading direction (x axis direction in FIG. 3) of the second image sensor 200 are arranged to be capable of detecting the phase difference only based on a signal of the phase difference detection pixels arranged in one row. By this means, when the reading direction (x axis direction) is pupil-divided, it is possible to detect the phase difference only from data of the phase difference detection pixels in one row of the rows of a plurality of phase difference detection pixels.

In rows in which only the light reception elements in the y axis direction are arranged, four pairs (pairs of D1 and D2) with respect to four exit pupil positions are sequentially arranged with respect to pairs of two light reception elements (D1cD1c and D1dD1d) which receive light on the opposite side with respect to the position of the identical exit pupil. Further, in the rows in which only the light reception elements in the y axis direction are arranged, the light reception elements are identical in the y axis direction with respect to the rows in which only the other light reception elements in the y axis direction are arranged. That is, vertical D1 row 311 in FIG. 3 indicates a column in which light reception elements positioned in this column in a vertical detection row are D1c and D1d. Similarly, D2 column 312 refers to a column in which light reception elements are D2c and D2d, vertical D3 column 313 refers to a column in which light reception elements are D3c and D3d and vertical D4 column 314 refers to a column in which light reception elements are D4c and D4d. That is, phase difference detection pixels to be pupil-divided in a direction (the y axis direction in FIG. 3) which is different at 90 degrees from the reading direction of the second image sensor 200 are arranged to be capable of detecting the phase difference based on signals of the phase difference detection pixels (four columns of the light reception elements) arranged in two continuous columns. Further, the rows of the phase difference detection pixels to be pupil-divided in the y axis direction and the rows of the phase difference detection pixels to be pupil-divided in the x axis direction are alternately arranged across the rows of the image generation pixels, so that an interval between the rows of the phase difference detection pixels to be pupil-divided in the y axis direction is narrow.

Thus, in the second image sensor 200, the rows in which the image generation pixels are arranged and the rows in which the phase difference detection pixels are arranged are alternately arranged.

Next, pixels included in an area 340 (4×4 light reception elements) will be focused upon and described with reference to FIG. 4 as to pixels according to the first embodiment of the present invention,

[Example of Arrangement of Pixels of Second Image Sensor]

Figure 4:
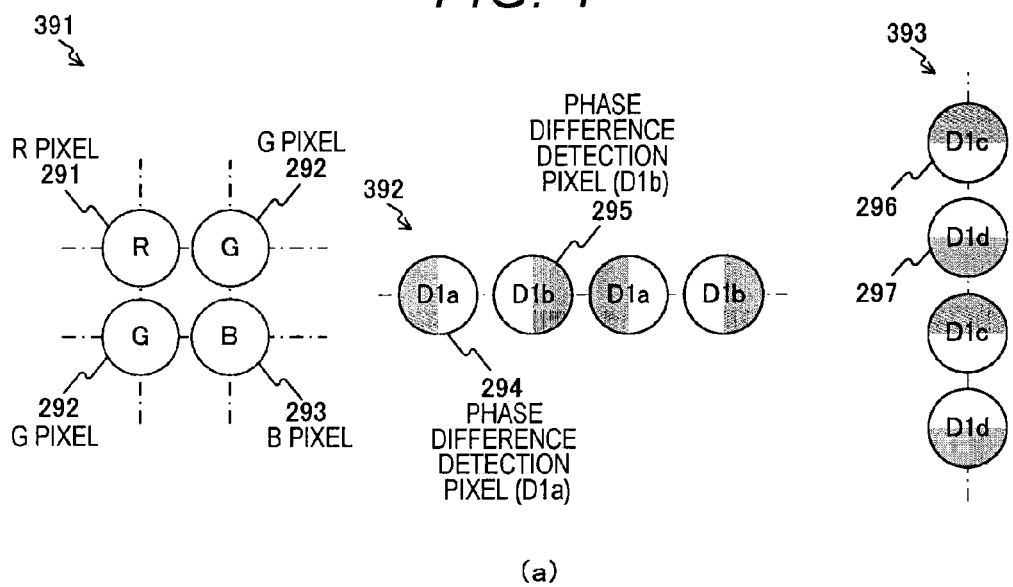
FIG. 4 is a top view schematically illustrating an example of an arrangement of pixels in an area 340 of the second image sensor 200 according to the first embodiment of the present invention and an example of an arrangement of pixels in a conventional image sensor.
Figure 4:
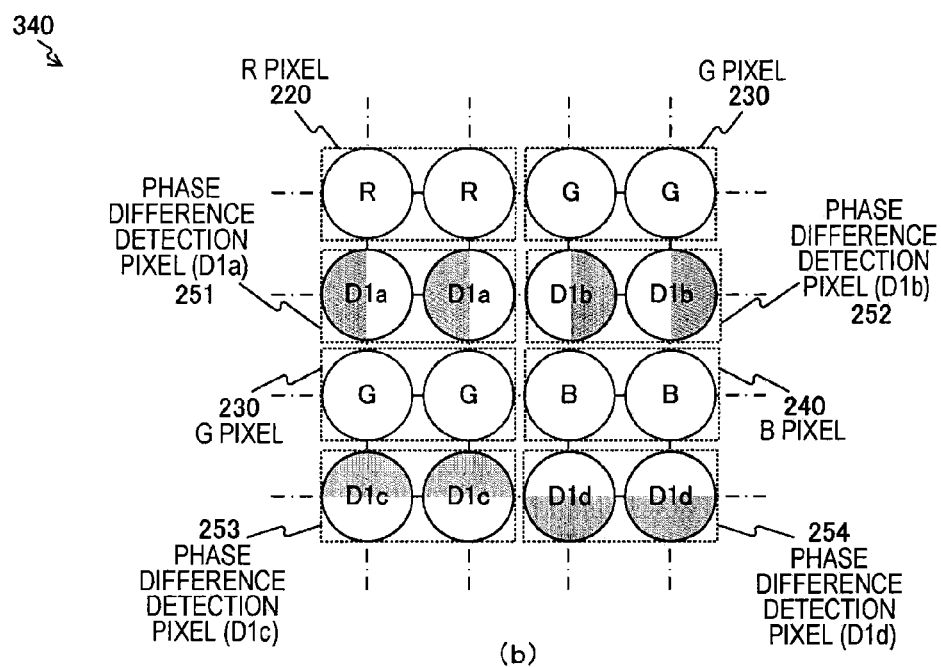

FIG. 4 is a top view schematically illustrating an example of an arrangement of pixels in the area 340 of the second image sensor 200 according to the first embodiment of the present invention and an example of an arrangement of pixels in a conventional image sensor. In addition, FIG. 4 will be described assuming xy axes where left and right directions is a y axis and up and down directions are a x axis direction. Further, the signal reading direction is the x axis direction (read in row units).

FIG. 4(a) illustrates a pixel arrangement of three pixel groups (pixel groups 391 to 393) schematically illustrating image generation pixels in a conventional image sensor to which image generation pixels and phase difference detection pixels are provided and a pixel arrangement of the phase difference detection pixels in the conventional image sensor.

The pixel group 391 is pixels of two rows and two columns indicating a pixel arrangement of the image generation pixels in the conventional image sensor to which both of the image generation pixels and the phase difference detection pixels are provided. In the pixel group 391, a pixel (R pixel 291) which receives red light by means of a color filter which allows transmission of red light is arranged on an upper left, and pixels (G pixel 292) which receive green light by means of a color filter which allows transmission of green light are arranged on an upper right and a lower left. Further, in the pixel group 391, a pixel (B pixel 293) which receives blue light by means of a color filter which allows transmission of blue light is arranged on a lower right. Thus, in the image generation pixels of the conventional image sensor, three colors of blue, green and red are arranged in Bayer alignment. Further, with the image generation pixels of the conventional image sensor, pixels provided in the arrangement indicated by the pixel group 391 form most part of the image sensors.

The pixel group 392 is pixels of one row and four columns indicating a pixel arrangement of the phase difference detection pixels provided in the x axis direction in the conventional image sensor. In the pixel group 392, a phase difference detection pixel (phase difference detection pixel (D1a) 294) on the left side of which light is blocked, and a phase difference detection pixel (phase difference detection pixel (D1b) 295) on the right side of which light is blocked are alternately arranged in the x axis direction.

The pixel group 393 includes pixels of four rows and one column indicating a pixel arrangement of the phase difference detection pixels provided in the y axis direction in the conventional image sensor. In the pixel group 393, the phase difference detection pixel (phase difference detection pixel (D1c) 296) on an upper side of which light is blocked and a phase difference detection pixel (phase difference detection pixel (D1d) 297) on a lower side of which light is blocked are alternately arranged in the y axis direction.

Meanwhile, positions of phase difference detection pixels in the conventional image sensor will be described. In the conventional image sensor, it is necessary to supplement image information about the positions of the phase difference detection pixels which cannot generate signals which can be used to generated images, and therefore the phase difference detection pixels the number of which is as small as possible are arranged. That is, in the conventional image sensor, most of pixels are pixels indicating the pixel group 391, and only pixels at sites at which phase differences are phase difference detection pixels provided in arrangements as indicated by the pixel group 392 and the pixel group 393.

FIG. 4(b) illustrates pixels corresponding to the area 340 in FIG. 3 as a pixel arrangement in the second image sensor 200 according to the first embodiment of the present invention. FIG. 4(b) illustrates a pixel (R pixel 220) which has two light reception elements which receive red (R) light and a pixel (G pixel 230) which has two light reception elements which receive green (G) light. Further, FIG. 4(b) illustrates a pixel (B pixel 240) which has two light reception elements) which receive blue (B) light as an image generation pixel. Furthermore, FIG. 4(b) a pixel (phase difference detection pixel (D1a) 251) which has two light reception elements (D1a) on the left side of which light is blocked and a pixel (phase difference detection pixel (D1b) 252) which has two light reception elements (D1b) on the right side of which light is blocked. Still further, FIG. 4(b) illustrates a pixel (phase difference detection pixel (D1c) 253) which has two light reception elements (D1c) on the upper side of which is blocked and a pixel (phase difference detection pixel (D1d) 254) which has two light reception elements (D1a) on the lower side of which light is blocked).

Thus, the image generation pixels and the phase difference detection pixels of the second image sensor 200 each have two light reception elements. In addition, in view only from the image generation pixels except the rows in which the light reception elements of the phase difference detection pixels are arranged, R pixel 220 is provided at the upper left, the G pixel 230 are provided at the upper right and the lower left and the B pixel 240 is provided on the lower right in Bayer alignment similar to FIG. 4(a). In the second image sensor 200, all pixels are formed in the arrangement indicated by the area 210, and therefore the arrangement of only the image generation pixels except the rows in which light reception elements of the phase difference detection pixels is uniform Bayer alignment.

[Configuration Example of Image Sensor]

Figure 5:
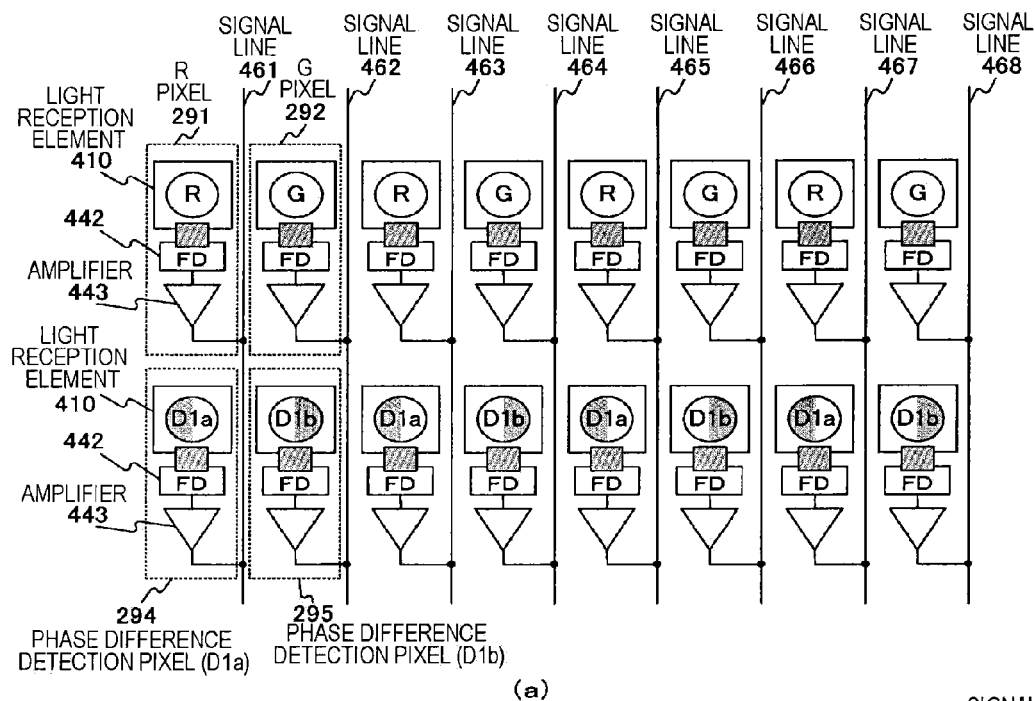
FIG. 5 is a schematic view illustrating an internal configuration of the pixel of the second image sensor 200 according to the first embodiment of the present invention, and an internal configuration of the pixel of the conventional image sensor.
Figure 5:
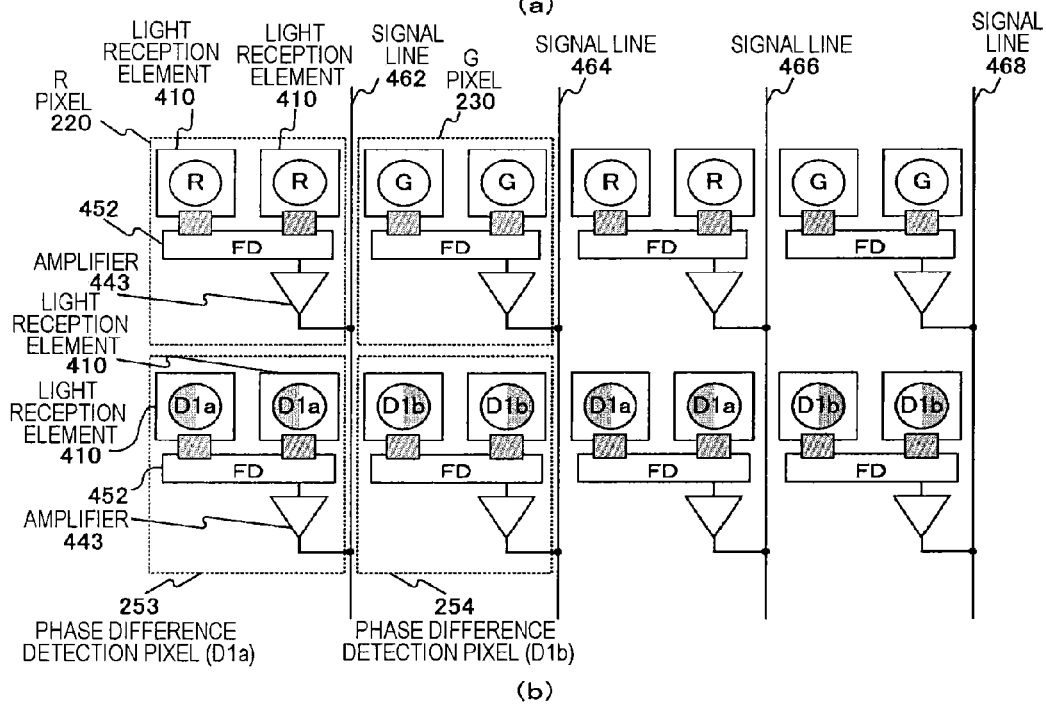

FIG. 5 is a schematic view illustrating an internal configuration of the pixel of the second image sensor 200 according to the first embodiment of the present invention, and an internal configuration of the pixel of the conventional image sensor.

FIG. 5(a) illustrates a schematic view of the image generation pixels and the phase difference detection pixels arranged in the conventional image sensor to which both of the image generation pixels and the phase difference detection pixels are provided. FIG. 5(a) will be described assuming an area in which a row in which pixel generation pixels are arranged and a row in which phase difference detection pixels are arranged. FIG. 5(a) illustrates the R pixels 291, the G pixels 292, the phase difference detection pixels (D1a) 294), the phase difference detection pixels (D1b) 295 and signal lines 461 to 468.

The R pixel 291 is a pixel which has a color filter which allows transmission of red light, and has a light reception element 410, a FD (Floating Diffusion) 442) and an amplifier 443).

The light reception element 410 converts (photoelectrically converts) the received light into an electric signal to generate an electric signal having the intensity matching the amount of the received light. This light reception element 410 is formed with, for example, a photo diode (PD).

The FD 442 detects an electric charge of the light reception element. This FD 442 converts the detected electric charge into a voltage, and supplies the voltage to the amplifier 443.

The amplifier 443 amplifies the voltage supplied from the FD 442. This amplifier 443 supplies the amplified voltage to the signal line 461.

In addition, the G pixel 292 is the same as the R pixel 291 except that a color filter which allows transmission of green light is provided instead of the color filter which allows transmission of red light, and therefore will not be described.

Further, the phase difference detection pixel (D1a) 294 and the phase difference detection pixel (D1b) 295 are the same as the R pixel 291 except that there is not a color filter and light is blocked with respect to half of the light reception elements by the light block unit (for example, part of wirings).

The signal lines 461 to 468 read signals generated by each pixel connected to these signal lines. In the second image sensor 200, data generated by the pixels is sequentially read in the horizontal direction (column direction) which is a reading direction through these signal lines 461 to 468. When, for example, data of pixels in a row (a row in which the R pixel 291 and the G pixels 292 are alternately arranged) of the image generation pixels, the row of the image generation pixels is set (set in the y axis direction) as a row to read data from the pixels. Further, columns to read data from pixels are sequentially set (set in the x axis direction), and data is sequentially read from the pixels. Assuming that data is sequentially read from the left, data of the image generation pixel (R pixel 291) connected to the signal line 461 is read first in FIG. 5(a). Next, data of the pixel generation pixel (G pixels 292) connected to the signal line 462 is read and then data is read from the image generation pixels connected to the signal line 463, that is, data is sequentially read.

Thus, the conventional image sensor is formed with pixels (image generation pixels and phase difference detection pixels) which each have the light reception element 410, the FD 442 and the amplifier 443.

FIG. 5(b) is a schematic view illustrating image generation pixels and phase difference detection pixels arranged in the second image sensor 200 according to the first embodiment of the present invention. FIG. 5(b) will be described assuming that eight and two light reception elements (four and two pixels) in the top row and the second row from the top of the area 210 illustrated in FIG. 3. FIG. 5(b) illustrates the R pixels 220, the G pixels 230, the phase difference detection pixels (D1a) 253, the phase difference detection pixels (D1b) 254, and the signal lines 462, 464, 466 and 468.

The R pixel 220 is a pixel which has two light reception elements which have color filters which allow transmission of red light, and has two light reception elements 410, the amplifier 443 and the FD 452.

In addition, the light reception elements 410 and the amplifier 443 are the same as illustrated in FIG. 5(a), and therefore will not be described.

The FD 452 detects an electric charge of the light reception elements, converts the electric charges detected by the two connected light reception elements 410 into voltages and supplies the voltage to the amplifier 443. While the FD 442 illustrated in FIG. 5(a) detects the electric charge detected by one light reception element 410, this FD 452 detects the electric charges detected by the two light reception elements 410.

In addition, the G pixel 230 is the same as the R pixel 220 except that a color filter which allows transmission of green light is provided instead of the color filter which allows transmission of red light, and therefore will not be described.

Further, the phase difference detection pixel (D1a) 253 and the phase difference detection pixel (D1b) 254 are the same as the R pixel 220 except that there is not a color filter and the light block unit (for example, part of a wiring) blocks light with respect to half of the light reception elements, and therefore will not be described.

The signal lines 462, 464, 466 and 468 read signals generated by each pixel connected to these signal lines. The number of signal lines indicated in FIG. 5(b) is half compared to the number of signal lines illustrated in FIG. 5(a). In addition, the signal lines 462, 464, 466 and 468 are the same as illustrated in FIG. 5(a) except that the number of signal lines is small and each connected pixel is different, and therefore will not be described.

Thus, the second image sensor 200 according to the first embodiment of the present invention is formed with pixels (image generation pixels and phase difference detection pixels) which each have the two light reception elements 410, the FD 442 and the amplifier 443.

[Example of Pupil Division Performed by Four Types of Phase Difference Detecting Pixels]

Figure 6:
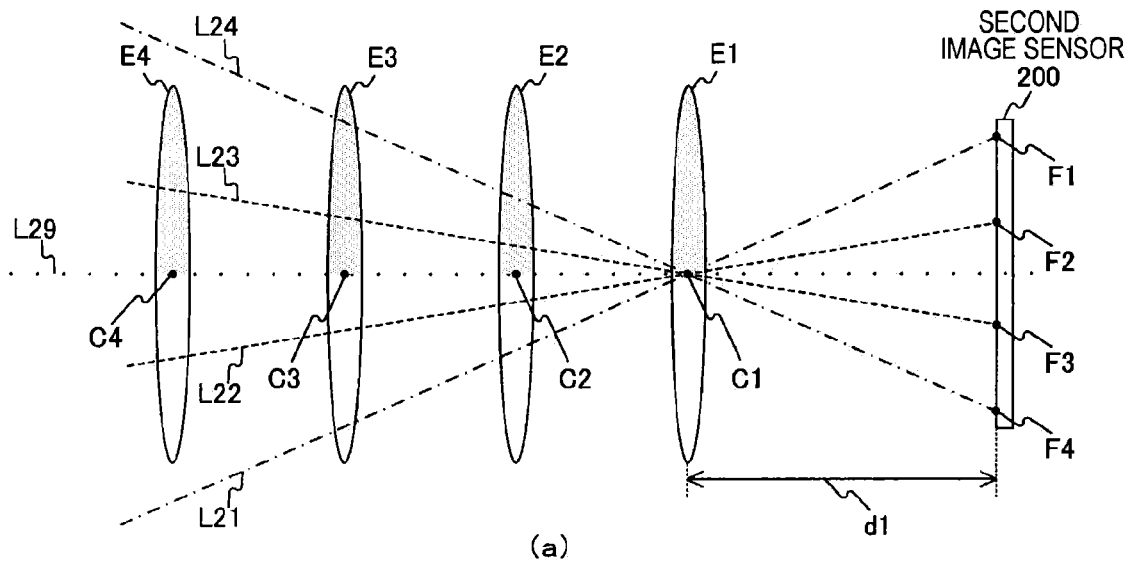
FIG. 6 is a schematic view illustrating pupil division of a phase difference detecting pixel D1 and a phase difference detecting pixel D2 according to the first embodiment of the present invention.
Figure 6:
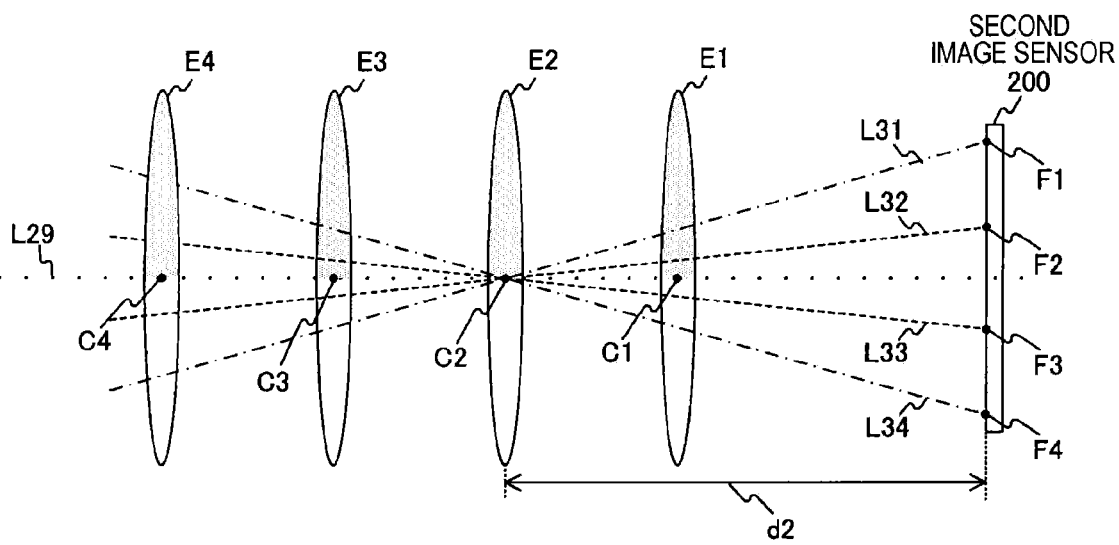
Figure 7:
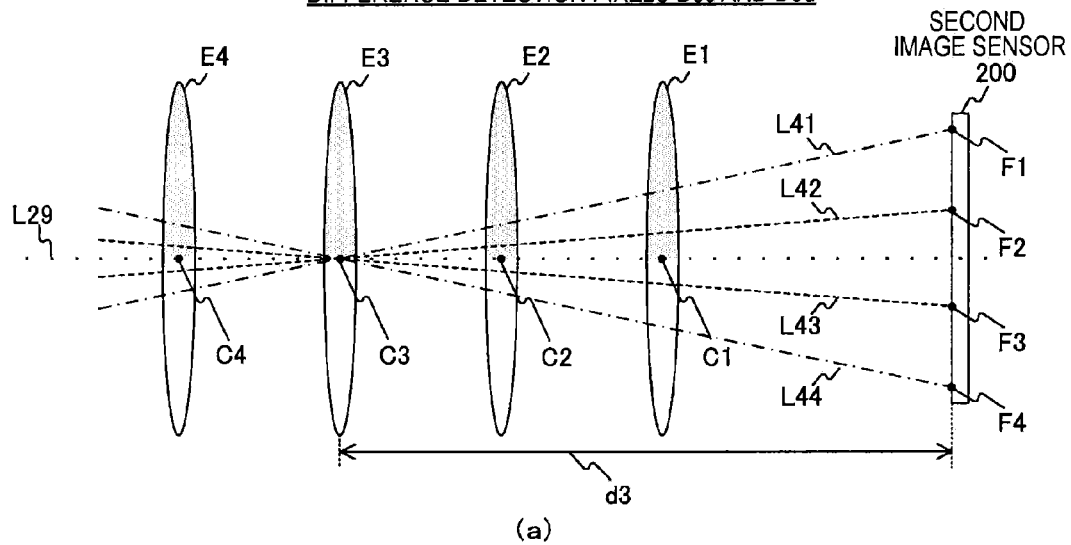
FIG. 7 is a schematic view illustrating pupil division of a phase difference detecting pixel D3 and a phase difference detecting pixel D4 according to the first embodiment of the present invention.
Figure 7:
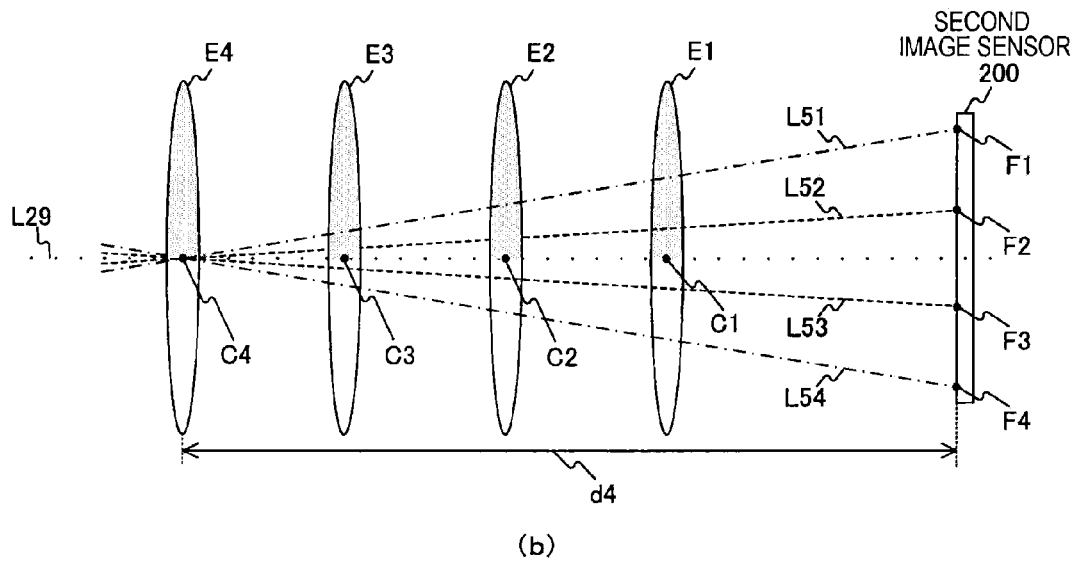

FIGS. 6 and 7 are schematic views illustrating pupil division of four types of phase difference detecting pixels (D1 to D4) according to the first embodiment of the present invention. In addition, although the second image sensor 200 is arranged above the pellicle mirror 160 as illustrated in FIG. 2, the second image sensor 200 will be described as an image sensor parallel to an exit pupil with reference to FIGS. 6 and 7 for ease of description.

FIG. 6 is a schematic view illustrating pupil division of the phase difference detecting pixel D1 and the phase difference detecting pixel D2 according to the first embodiment of the present invention.

FIG. 6(*a*) schematically illustrates a relationship between pupil division performed by the phase difference detection pixel (phase difference detection pixel D1) corresponding to the exit pupil at a position d1 and exit pupils at the positions d1 to d4. FIG. 6(*a*) illustrates four exit pupils (exit pupils E1 to E4) at different distances from the second image sensor 200, and the second image sensor 200. Further, in the exit pupils E1 to E4, center points (centers C1 to C4) indicating the centers of the respective exit pupils are indicated.

Furthermore, in the second image sensor 200, four positions (F1 to F4) are indicated as positions of phase difference detection pixels in the second image sensor 200. The position F1 and the position F4 have the same distance (image height) from the center of the second image sensor 200, and indicates positions from the center which are opposite from each other. Further, the position F2 and the position F3 also have the same image heights and indicate positions from the center which are opposite from each other. In addition, the up and down directions of the second image sensor 200 illustrated in FIG. 6(*a*) are the up and down directions (y axis direction) of the area 210 of the second image sensor 200 illustrated in FIG. 3.

Further, FIG. 6(*a*) illustrate pupil division lines L21 to L24 as axes indicating boundaries between areas divided by the phase difference detection pixel D1 at the positions F1 to F4. In addition, FIG. 6(*a*) will be described assuming that the phase difference detection pixels D1 at the positions F1 to F4 are the phase difference detection pixels (D1*c*) 253 on the upper side (an upper direction in FIG. 6(*a*)) of the light reception of which is covered by the light block unit.

Hereinafter, pupil-division by the phase difference detection pixel (Inc) 253 at the position F1 will be described.

In the phase difference detection pixel (D1*c*) 253, a light block unit is formed to perform pupil division of dividing the exit pupil E1 into two. By this means, the phase difference detection pixel (D1*c*) 253) at the position F1 receives subject light from the upper side of this pupil division line L21 based on the boundary of the pupil division line L21. In addition, as a method of disposing the light block unit matching the position of this exit pupil E1, for example, a method (see, for example, Japanese Patent Application Laid-Open No. 2009-204987) of varying an arrangement of the light block unit between pixels can be used.

The phase difference detection pixel (D1*c*) 253 at the position F1 performs pupil division with respect to the exit pupil E1 to divide the exit pupil E1 by forming the light block unit to meet the position of the exit pupil E1. However, the pupil division line L21 is diagonal to the optical axis (a dotted line L29 in FIG. 6), and therefore it is not possible to perform pupil division with respect to the exit pupils at the other positions to divide the exit pupil into two. For example, as to the exit pupil E2, the phase difference detection pixel (D1*c*) 253 at the position F1 receives subject light passing through an area which is three-fourths from the top of the exit pupil E2. Further, as to the exit pupil E3, subject light passing the area which is 90% from the top of the exit pupil E3 is received. Furthermore, as to the exit pupil E4, the entire subject light passing the exit pupil E4 is received.

Thus, the phase difference detection image (D1*c*) 253 at the position F1 can perform pupil division of dividing the exit pupil E1 at the position d1 into two, and can precisely detect the phase difference for the exit pupil E1. However, subject light is not divided into two for the exit pupils E2 to E4, and precision to detect the phase difference deteriorates.

In addition, although, similar to the position F1, in the phase difference detection pixels (D1*c*) 253 at the position F2 and the position F4, light block units are formed to meet the position of the exit pupil E1 and the phase difference can be precisely detected for the exit pupil E1, precision deteriorates for the exit pupils E2 to E4.

Thus, although the phase detection pixel D1*c* precisely detects the phase difference for the exit pupil E1, precision for the exit pupils E2 to E4 deteriorates.

FIG. 6(*b*) schematically illustrates a relationship between pupil division performed by the phase difference detection pixel (phase difference detection pixel D2) corresponding to the exit pupils at the position d2 and an exit pupil at the positions d1 to d4. Similar to FIG. 6(*a*), FIG. 6(*b*) illustrates the exit pupils (exit pupils E1 to E4) and the second image sensor 200.

Instead of the exit pupil lines L21 to L24 illustrated in FIG. 6(*a*), FIG. 6(*b*) illustrates exit pupil lines L31 to L34 as axes indicating boundaries between areas at which the phase difference detection pixels D2 at the positions F1 to F4 are divided.

In the phase difference detection pixel D2, a light block unit is formed to be capable of performing pupil division of dividing the exit pupil E2 into two. That is, although, as illustrated in FIG. 6(*b*), the phase difference detection pixel D2 can precisely detect the phase difference for the exit pupil E2, precision for the exit pupils E1, E3 and E4 deteriorates.

FIG. 7 is a schematic view illustrating pupil division of the phase difference detecting pixel D3 and the phase difference detecting pixel D4 according to the first embodiment of the present invention.

FIG. 7(*a*) schematically illustrates a relationship between pupil division performed by the phase difference detection pixel (phase difference detection pixel D3) corresponding to the exit pupil at the position d3 and exit pupils at the positions d1 to d4. Similar to FIG. 6(*a*), FIG. 7(*a*) illustrates the exit pupils (exit pupils E1 to E4) and the second image sensor 200.

Instead of the exit pupil lines L21 to L24 illustrated in FIG. 6(*a*), FIG. 7(*a*) illustrates exit pupil lines L41 to L44 as axes indicating boundaries between areas at which the phase difference detection pixels D3 at the positions F1 to F4 are divided.

In the phase difference detection pixel D3, a light block unit is formed to be capable of performing pupil division of dividing the exit pupil E3 into two. That is, although, as illustrated in FIG. 7(*a*), the phase difference detection pixel D3 can precisely detect the phase difference for the exit pupil E3, precision for the exit pupils E1, E2 and E4 deteriorates.

FIG. 7(*b*) schematically illustrates a relationship between pupil division performed by the phase difference detection pixel (phase difference detection pixel D4) corresponding to the exit pupil at the position d4 and exit pupils at the positions d1 to d4. Similar to FIG. 6(*a*), FIG. 7(*b*) illustrates the exit pupils (exit pupils E1 to E4) and the second image sensor 200.

Instead of the exit pupil lines L21 to L24 illustrated in FIG. 6(*a*), FIG. 7(*b*) illustrates exit pupil lines L51 to L54 as axes indicating boundaries between areas at which the phase difference detection pixels D4 at the positions F1 to F4 are divided.

In the phase difference detection pixel D4, a light block unit is formed to be capable of performing pupil division of dividing the exit pupil E4 into two. That is, although, as illustrated in FIG. 7(*b*), the phase difference detection pixel D4 can precisely detect the phase difference for the exit pupil E4, precision for the exit pupils E1 to E3 deteriorates.

Thus, in the phase difference detection pixels D1 to D4, light block units are formed to meet the exit pupils at different positions. Thus, by providing in the second image sensor 200 the phase difference detection pixels meeting exit pupils at different positions, when the imaging device 100 is a single-lens reflex camera in which a lens unit can be exchanged, it is also possible to support an exchange lens in which exit pupils are at different positions.

In addition, although the phase difference detection pixels D1 to D4 meeting the positions of the four exit pupils have been assumed, the phase difference detection pixels are by no means limited to this. As long as rows of phase difference detection pixels and rows of image generation pixels are alternately arranged (a rate of phase difference detection pixels neighbor to image generation pixels is fixed), the number may be other than four. When, for example, the second image sensor 200 is provided to a lens integrated camera, only a phase difference detection pixel may be arranged with respect to the position of one exit pupil.

[Example of Pixel neighbor to Image Generation Pixel]

Figure 8:
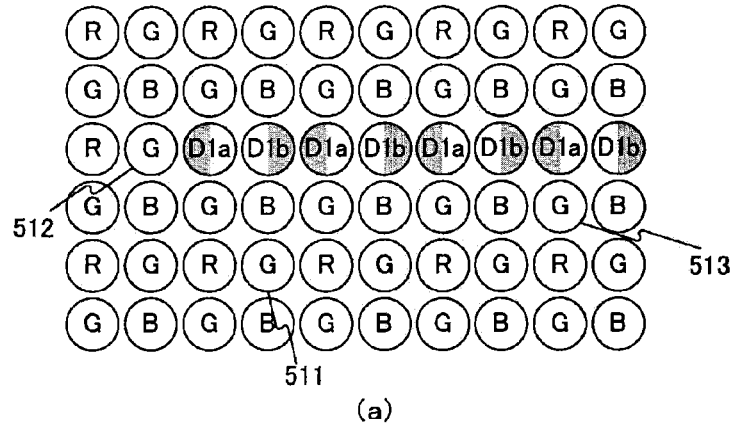
FIG. 8 is a schematic view illustrating pixels neighbor to image generating pixels of the second image sensor 200 according to the first embodiment of the present invention and pixels neighbor to image generating pixels of the conventional image sensor.
Figure 8:
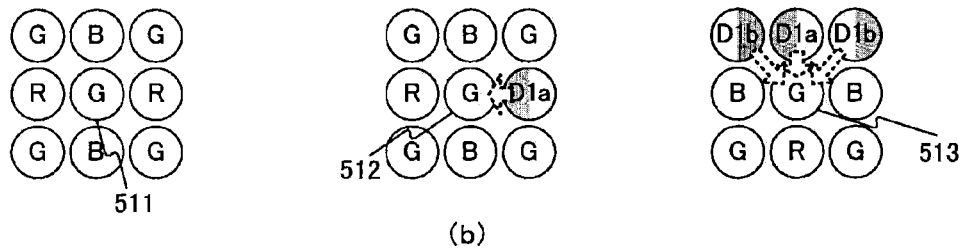
Figure 8:
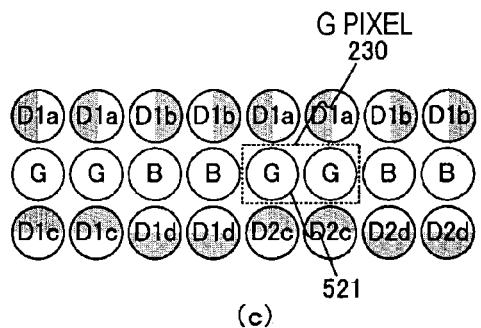
Figure 8:
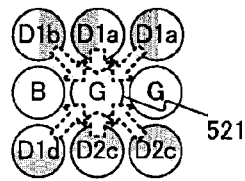

FIG. 8 is a schematic view illustrating pixels neighbor to image generating pixels of the second image sensor 200 according to the first embodiment of the present invention and pixels neighbor to image generating pixels of the conventional image sensor. In addition, an example of an influence of (a light reception element of) a phase difference detection pixel neighbor to (a light reception element of) an image generation pixel will be described with reference to FIG. 8 assuming that light of a low wavelength leaks. That is, it is assumed that the amount of leakage of low wavelength light varies and therefore a wavelength property of light received by a light reception element of the image generation pixel has slightly changed FIG. 8(a) illustrates an area (six rows and ten columns) in which image generation pixels and phase difference detection pixels in the conventional image sensor to which both of the image generation pixels and the phase difference detection pixels are provided are arranged. FIG. 8(a) illustrates an area in which eight phase difference detection pixels are arranged in one row which is the third row from the top, and the other pixels are all image generation pixels.

As illustrated in FIG. 8(a), in the conventional image sensor to which both of the image generation pixels and the phase detection pixels are provided, phase difference detection pixels are partially arranged. Hence, only the image generation pixels around the partially arranged phase difference detection pixels are image generation pixels neighbor to the phase difference detection pixels.

Hereinafter, three G pixels (G pixels 511 to 513) of different neighboring pixels among pixels in the area illustrated in FIG. 8(a) will be focused upon, and described with reference to FIG. 8(b).

In FIG. 8(b), the G pixels 511 to 513 illustrated in FIG. 8(a) are indicated together with arrows indicating lights leaking from the phase detection pixels.

The G pixel 511 is the G pixel in which eight neighboring pixels are all image generation pixels. This G pixel 511 does not include a phase difference detection pixel in a neighboring pixel, and therefore has the same property as pixels of an image sensor which do not have phase difference detection pixels.

The G pixel 512 is the G pixel in which seven of the eight neighboring pixels are image generation pixels, and one is the phase difference detection pixel. This G pixel 512 is neighbor to one phase difference detection pixel, and therefore is influenced by this phase difference detection pixel. When, for example, the phase difference detection pixel does not have a color filter, light of a short wavelength leaks to the G pixel 512 from the neighboring phase difference detection pixel. This causes that the wavelength property of light received by the light reception element of the G pixel 512 is slightly different from the wavelength property of the G pixel 511.

The G pixel 513 is the G pixel in which five of the eight neighboring pixels are image generation pixels, and three are the phase difference detection pixels. This G pixel 513 is neighbor to the three phase difference detection pixels, and therefore is influenced by these three phase difference detection pixels. That is, the amount of leaking light increases compared to the G pixel 512. Therefore, the wavelength property of light received by the light reception element of the G pixel 513 differs from the wavelength property of the G pixel 511 and the wavelength property of the G pixel 512.

Thus, in the conventional image sensor to which both of the image generation pixels and the phase difference detection pixels are provided, there are image generation pixels which are neighbor to the phase difference detection pixels and image generation pixels which are not neighbor to the phase difference detection pixels. Hence, a problem occurs that the wavelength property of light received by the light reception elements of the image generation pixels varies.

FIG. 8(c) illustrates an area in which a row in which G pixels and B pixels in the second image sensor 200 according to the first embodiment of the present invention are arranged as image generation pixels, and rows in which phase difference detection pixels which are vertically neighbor to this row are arranged. FIG. 8(c) will be described assuming that light reception elements of three rows and eight columns (three x four pixels) in the second row and the fourth row from the top of the area 210 in FIG. 3.

As illustrated in FIG. 8(c), in the second image sensor 200, rows (upper and lower rows) of the row of the image generation pixels are rows in which phase difference detection pixels are arranged. Hence, all image generation pixels are image generation pixels neighbor to the phase difference detection pixels.

Meanwhile, a neighboring phase difference detection pixel will be described with reference to FIG. 8(d) by focusing upon one light reception element (light reception element 521) in the G pixel 230.

In FIG. 8(d), the light reception element 521 illustrated in FIG. 8(c) is indicated together with arrows indicating lights leaking from the phase detection pixels.

As to the light reception element 521, two of the neighboring eight light reception elements are light reception elements, and six are light reception elements of the phase difference detection pixels. This light reception element 521 is neighbor to the six light reception elements of the phase difference detection pixels, and therefore is influenced by the six light reception elements of the phase difference detection pixels. In addition, rows of the phase difference detection pixels and rows of image generation pixels are alternately arranged in the second image sensor 200, and therefore all image generation pixels except ends of the rows are neighbor to the six light reception elements of the phase difference detection pixels (a rate of phase difference detection pixels and image generation pixels of neighboring pixels is fixed).

As illustrated in FIG. 8(d), in the second image sensor 200, light reception elements of all image generation pixels except pixels at the ends of the second image sensor 200 are influenced by the six light reception elements of the phase difference detection pixels, and therefore the wavelength property of light received by the light reception elements of the image generation pixels becomes uniform. That is, the pixels at the ends of the second image sensor 200 are not used (removed from effective pixels), so that it is not necessary to correct the wavelength property of light received by the light reception elements.

Thus, the rate of light reception elements of the phase difference detection pixels and light reception elements of the image generation pixels are made uniform for light reception elements neighbor to light reception elements of the image generation pixels in an area of effective pixels, so that it is possible to make the property of the light reception elements of the image generation pixels uniform. In addition, although a case has been described with the first embodiment of the present invention where the image generation pixel has two light reception elements, the image generation pixel is not limited to this, and it is possible to obtain the same effect even when an image generation pixel has one light reception element. That is, the rate of phase difference detection pixels and image generation pixels is fixed for each pixel neighbor to the image generation pixels in an area of effective pixels (pixels which receive subject light and generate an image), so that it is possible to make the property of light reception elements of the image generation pixels uniform.

[Example of Image generated by Second Image Sensor]

Figure 9:
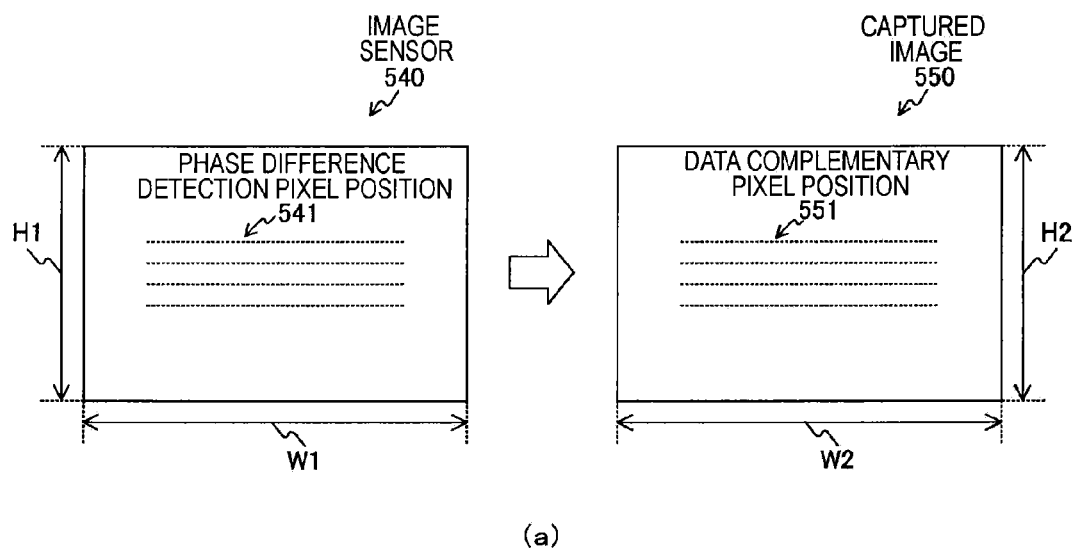
FIG. 9 is a schematic view illustrating a captured image generated based on a signal of the second image sensor 200 according to the first embodiment of the present invention and a captured image generated based on a signal of the conventional image sensor.
Figure 9:
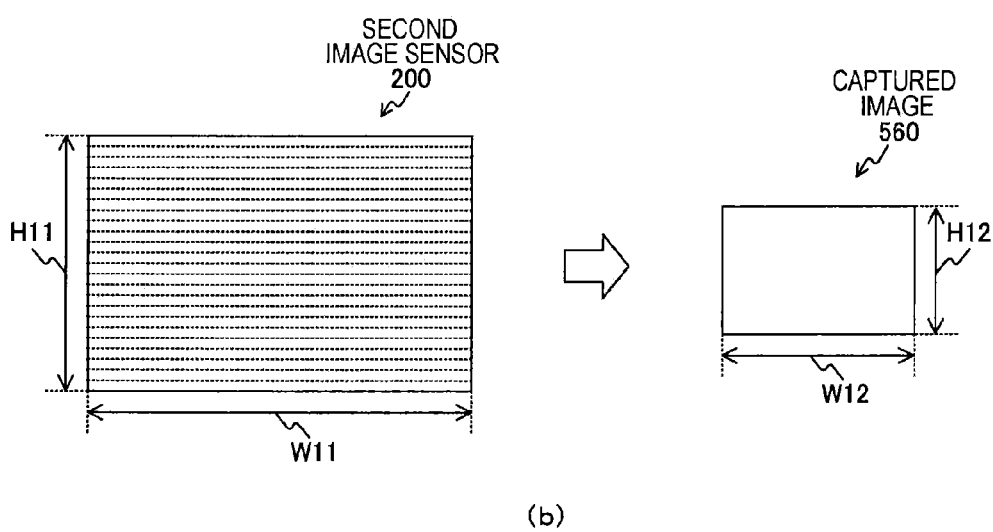

FIG. 9 is a schematic view illustrating a captured image generated based on a signal of the second image sensor 200 according to the first embodiment of the present invention and a captured image generated based on a signal of the conventional image sensor. In addition, in FIG. 9, a captured image to be generated is an image having the maximum number of pixels which can be generated by each image sensor.

FIG. 9(a) illustrates a captured (captured image 550) which is generated based on signals outputted from the conventional image sensor (image sensor 540) to which image generation pixels and the phase difference detection pixels are provided and an image sensor 540.

In the image sensor 540, phase difference detection pixels are arranged in part of four rows, and sites at which these phase difference detection pixels are arranged are schematically illustrated by broken lines (phase difference detection pixel position 541). Further, the magnitude (the number of light reception elements (pixels) in the horizontal direction (reading direction) of the image sensor 540 is W1, and the magnitude (the number of light reception elements (pixels) in the vertical direction (a direction orthogonal to the reading direction) is H1.

In the captured image 550, sites of image data including positions of the phase difference detection pixels are schematically indicated by broken lines (data supplement pixel positions 551). Further, the magnitude (the number of light reception elements) in the horizontal direction (reading direction) of the captured image 550) is W2, and the magnitude (the number of light reception elements) in the vertical direction is H2.

Hereinafter, generation of the captured image 550 by the image sensor 540 will be described.

In the image sensor 540, part of pixels are phase difference detection pixels, and, when a captured image is generated, image data at the position of the phase difference detection image is predicted from data of surrounding image generation pixels and supplemented. Further, the image sensor 540 has one light reception element in one image generation pixel, so that the maximum number of pixels of the captured image generated based on a signal from the signal of the image sensor 540 is equal to the number of light reception elements in the image sensor 540.

That is, as illustrated in FIG. 9(a), a captured image 550 generated from a signal of a conventional image sensor is an image including the position (the data supplement pixel position 551) at which data of the position (phase difference detection pixel position 541 of the image sensor 540) of the phase difference detection pixel is supplemented. Further, in the captured image 550, the number of pixels (W2) in the horizontal direction is the same as the number of light reception elements (pixels) (W1) in the horizontal direction of the image sensor 540, and the number of pixels (H2) in the vertical direction is also the same as the number of light reception elements (pixels) (H1) in the vertical direction of the image sensor 540. When, for example, the number of effective light reception elements (the number of light reception elements used to generate a captured image) of the image sensor 540 is 4592 columns and 3056 rows, the captured image 550 having the number of pixels 4592 columns×3056 rows is generated.

FIG. 9(b) illustrates the second image sensor 200 according to the first embodiment of the present invention and a captured image (captured image 560) generated from a signal outputted from this second image sensor 200.

In the second image sensor 200, rows of phase difference detection pixels and rows of captured images are alternately arranged, and the rows of these phase difference detection pixels are schematically illustrated by a plurality of broken lines. Further, the magnitude (the number of light reception elements) in the horizontal direction (reading direction) of the second image sensor 200 is W11, and the magnitude (the number of light reception elements) in the vertical direction is H11. Furthermore, in the captured image 560, the magnitude (the number of pixels) in the horizontal direction (reading direction) of the captured image 560 is W12, and the magnitude (the number of pixels) in the vertical direction is H12.

Hereinafter, generation of the captured image 560 by the second image sensor 200 will be described.

In the second image sensor 200, rows of phase difference detection pixels and rows of image generation pixels are alternately arranged, and, when a captured image is generated, the captured image is generated using only data of the rows of the image generation pixels. Further, half of the pixels are phase difference detection pixels, and therefore, when a captured image is generated, image data at positions of the phase difference detection pixels are not supplemented. By this means, the maximum number of pixels in the vertical direction of the captured image generated from the signal of the second image sensor 200 is half the number of light reception elements in the vertical direction of the image sensor 540 (the number of pixels is also half). Further, the second image sensor 200 has two light reception elements in one image generation pixel, the number of maximum pixels in the horizontal direction of the captured image generated from the signal of the second image sensor 200 is half the number of light reception elements in the horizontal direction in the image sensor 540 (the number of pixels is equal).

That is, as illustrated in FIG. 9(b), the captured image 560 generated from the signal of the second image sensor 200 is an image which does not include data obtained by supplementing data at the positions of the phase difference detection pixels, and which is formed only with data generated by the image capture element. Further, in the captured image 560, the number of pixels (W12) in the horizontal direction is half the number of light reception elements (W11) in the horizontal direction of the second image sensor 200, and the number of pixels (H12) in the vertical direction is half the number of light reception elements (H11) in the vertical direction of the second image sensor 200. When, for example, the number of effective light reception elements of the second image sensor 200 is 4592 columns and 3056 rows, the captured image 560 having the number of pixels of 2296 columns and 1528 rows is generated.

Thus, in the second image sensor 200, even though rows of phase difference detection pixels and rows of image generation pixels are alternately arranged, an aspect ratio of an image to be generated can be made the same as in the image sensor to which only image generation pixels are provided. That is, aspect ratios of an image (live view image) generated from the signal of the second image sensor 200) and an image (still image) generated from the signal of the first image sensor 140 can be made the same. By this means, it is possible to easily generate a live view image of a still image from the signal from the second image sensor 200 (without performing special correction processing).

In addition, although a case has been described with the first embodiment of the present invention where phase difference detection pixels which each have two light reception elements and image generation pixels which each have two light reception elements are used, the present invention is by no means limited to this. Even when image generation pixels which each have one light reception element are used, by generating an image using two pixels which have the identical color filters and which continue in the reading direction as a pair of pixels (a pixel unit of an image to be generated), it is possible to make the aspect ratios the same.

[Example of Data Reading Speed of Second Image Sensor]

Figure 10:
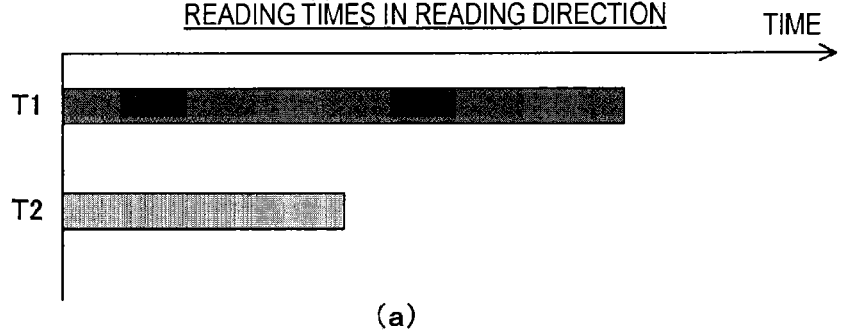
FIG. 10 is a graph illustrating an example of a data reading speed of the second image sensor 200 according to the first embodiment of the present invention and an example of a data reading speed of the conventional image sensor.
Figure 10:
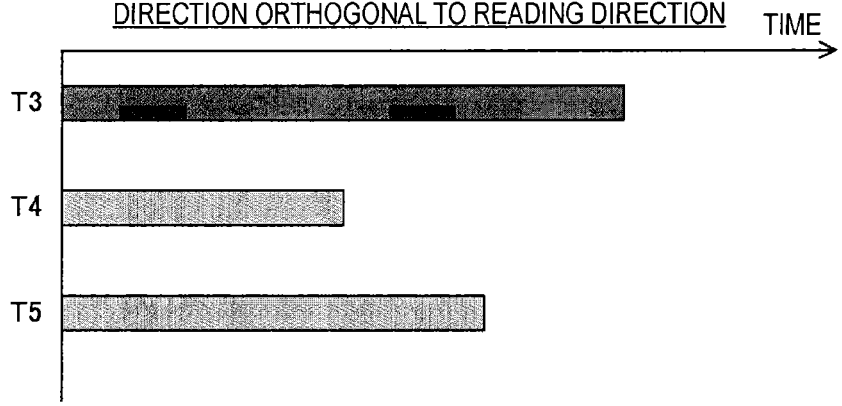
Figure 10:
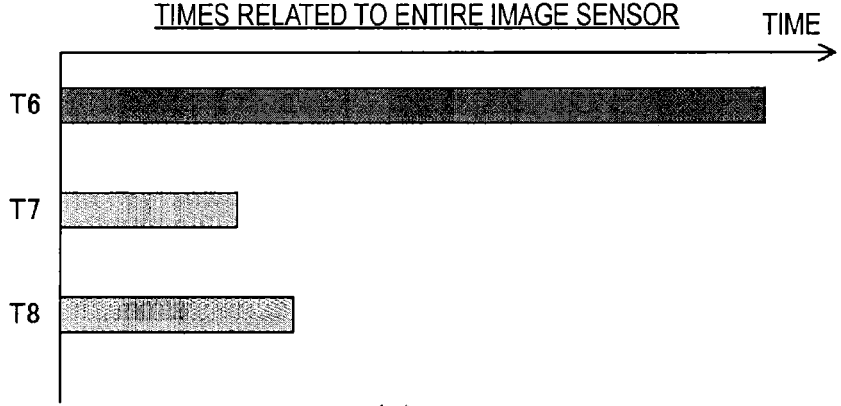

FIG. 10 is a graph illustrating an example of a data reading speed of the second image sensor 200 according to the first embodiment of the present invention and an example of a data reading speed of the conventional image sensor. Further, FIG. 10 illustrates a data reading speed when each image sensor generates a captured image having the maximum number of pixels.

In addition, similar to FIG. 9, FIG. 10 assumes that each image sensor has light reception elements of 4592 columns and 3056 rows. That is, the second image sensor 200 according to the first embodiment of the present invention has pixels of 2296 columns and 3056 rows, and the conventional image sensor has pixels of 4592 columns and 3056 rows. Further, most are image generation pixels in the conventional image sensor and a reading time does not become short even if reading of one to three rows is skipped, and it is assumed that data is read from all phase difference detection pixels for ease of description.

FIG. 10(a) illustrates a time required to read data of all pixels arranged in one row (a data reading time related to the reading direction) in a graph in which the horizontal axis is an axis indicating a data reading time. FIG. 10(a) illustrates a data reading time (time T1) of the conventional image sensor and a data reading time (time T2) of the second image sensor 200 according to the first embodiment of the present invention as data reading times.

Hereinafter, a difference between the time T1 and the time T2 will be described. The conventional image sensor has one light reception element in one image generation pixel, and reads data from pixels 4592 times per row. That is, the time T1 refers to the time related to 4592 times of reading of data.

Meanwhile, the second image sensor 200 has two light reception elements in one image generation pixel, and data is read from pixels 2296 times per row. That is, the time T2 refers to the time related to 2296 times of reading of data.

As illustrated in FIG. 10(a), the second image sensor 200 according to the first embodiment of the present invention has two light reception elements in one image generation pixels, and has a faster data reading speed per row than the conventional image sensor.

FIG. 10(b) illustrates a time required to read data of all pixels in the orthogonal direction orthogonal to the reading direction (a data reading time related to the orthogonal direction orthogonal to the reading direction) in the graph in which the horizontal axis is an axis indicating a data reading time. FIG. 10(b) illustrates a time (time T3) in the conventional image sensor and a time (time T4) of the second image sensor 200 when a phase difference is detected using phase difference detection pixels in one row (when pupil division is performed in the reading direction). Further, FIG. 10(b) illustrates a data reading time (time T5) of the second image sensor 200 when a phase difference is detected using phase difference detection pixels in a plurality of rows (pupil division is performed in a direction orthogonal to the reading direction).

Hereinafter, a difference between the time T3, the time T4 and the time T5 will be described. Most of pixels are image generation pixels in the conventional image sensor and there are also image generation pixels in rows in which phase difference detection pixels are provided, so that there are few rows from which data of pixels cannot be read. That is, in the conventional image sensor, rows to read are specified (specified in the y axis direction) 3056 times. That is, the time T3 refers to a time related to 3056 times of reading of data.

Meanwhile, rows of image generation pixels and rows of phase difference detection pixels are alternately arranged in the second image sensor 200, and the number of times of specifying rows to read which is required to generate a captured image is 1528 times (which is half 3056 rows). When pupil division in the horizontal direction is performed for rows of phase difference detection pixels, pupil division can be performed using data of phase difference detection pixels in at least one row. Further, when pupil division in the vertical direction is performed, pupil division can be performed using data of pixels arranged in columns of two pixels arranged in a pair of pixels among pixels in rows which are pupil-divided in the vertical direction. The time T4 refers to a time related to 1528 times+1 time of data reading upon pupil division in the horizontal direction, and the time T5 refers to a time related to 1528 times+764 times of data reading upon pupil division in the vertical direction.

As illustrated in FIG. 10 (b), rows in which only image generation pixels are arranged and rows in which only phase difference detection pixels are arranged are alternately arranged in the second image sensor 200 according to the first embodiment of the present invention, so that the number of rows which are not read increases compared to the conventional image sensor. By this means, the data reading speed becomes fast compared to the conventional image sensor.

FIG. 10(c) illustrates a time required to read data of pixels when one captured image is generated (a reading time related to the entire image sensor) in a graph in which the horizontal axis is an axis indicating a data reading time. FIG. 10(c) illustrates a data reading time (time T6) in the conventional image sensor and a data reading time (time T7) of the second image sensor 200 when a phase difference is detected using phase difference detection pixels in one row as data reading times. Further, FIG. 10(c) illustrates a data reading time (time T8) in the second image sensor 200 when a phase difference is detected using phase difference detection pixels in 764 rows.

Hereinafter, a difference between the time T6, the time T7 and the time T8 will be described. In the conventional image sensor, rows to read is specified (specified in the y axis direction) 3056 times, and data is read from pixels of each specified row 4592 times. That is, data is read from pixels 3056×4592 times. The time T6 refers to the time related to 3056×4592 times of data reading.

Meanwhile, when a phase difference is detected using phase difference detection pixels in one row, the second image sensor 200 specifies the rows to read 1528+1 times and read data from pixels of each specified data 2296 times. That is, data is read from pixels (1528+1)×2296 times. The time T7 refers to the time related to (1528+1)×2296 times of data reading.

Further, when a phase difference is detected in the vertical direction, the rows to read are specified 1528+764 times and data is read from pixels of each specified row 2296 times (for ease of description, data is read from all pixels in rows of phase difference detection pixels). That is, data is read from pixels (1528+764)×2296 times. The time T8 refers to the time related to (1528+764)×2296 times of data reading.

As illustrated in FIG. 10(*c*), the second image sensor 200 according to the first embodiment of the present invention has a faster data reading speed per row than the conventional image sensor.

Thus, with the first embodiment of the present invention, by fixing the rate of phase difference detection pixels neighbor to image generation pixels (light reception elements), it is possible to make the property of the image generation pixels uniform. By this means, it is possible to reduce correction processing related to the property of each pixel upon generation of a captured image.

Further, with the first embodiment of the present invention, in rows of image generation pixels, image generation pixels are arranged in Bayer alignment using two light reception elements which have filters of the identical property as one pair. By this means, it is possible to generate a captured image using the same processing as processing in conventional Bayer alignment, and reduce correction processing related to colors upon generation of the captured image.

Further, with the first embodiment of the present invention, one pixel has two light reception elements in the image generation pixels and the phase difference detection pixels. By this means, it is possible to shorten the time required to read data from pixels in the reading direction. Further, an area of a light reception plane in one pixel is widened, so that it is possible to make a signal generated by one pixel intense. Furthermore, it is possible to generate a captured image having the same aspect ratio as the image sensor to which only image generation pixels are provided.

<2. Modified Example>

A case has been described with the first embodiment of the present invention where phase difference detection pixels to be pupil-divided in the reading direction and phase difference detection pixels to be pupil-divided in a direction orthogonal to the reading direction are alternately arranged per line in the second image sensor 200. Meanwhile, phase difference detection pixels and image generation pixels may be provided in other arrangements. For example, rows of phase difference detection pixels and rows of image generation pixels can be alternately arranged such that the number of phase difference detection pixels neighbor to image generation pixels are uniform (the rate is fixed) in all image generation pixels. Thus, the arrangements of the phase difference detection pixels may include various patterns in addition to that described in the first embodiment.

Hence, an example of an image sensor which is opposite to a second image sensor according to a first embodiment where positions of phase difference detection pixels which forms a pair are different will be described with reference to FIG. 11 as an example of various patterns. Further, an example of an image sensor in which phase difference detection pixels are only pixels to be pupil-divided in the reading direction will be described with reference to FIGS. 12 and 13. Furthermore, an example of an image sensor in which rows of phase difference detection pixels and rows of image generation pixels are alternately arranged every two other rows will be described with reference to FIG. 14.

[Example of Arrangement of Pixels of Second Image Sensor]

FIGS. 11 to 14 are schematic views illustrating arrangements of light reception elements of the second image sensor according to a modified example of the first embodiment of the present invention. For ease of description, FIGS. 11 to 14 will be described using an area of part of light reception elements (light reception elements of sixteen rows and sixteen columns) of light reception elements of each pixel forming the second image sensor 200. In addition, subsequent to FIGS. 11 to 14, a difference from an area 210 according to the first embodiment of the present invention illustrated in FIG. 3 will be focused upon and described.

Figure 11:
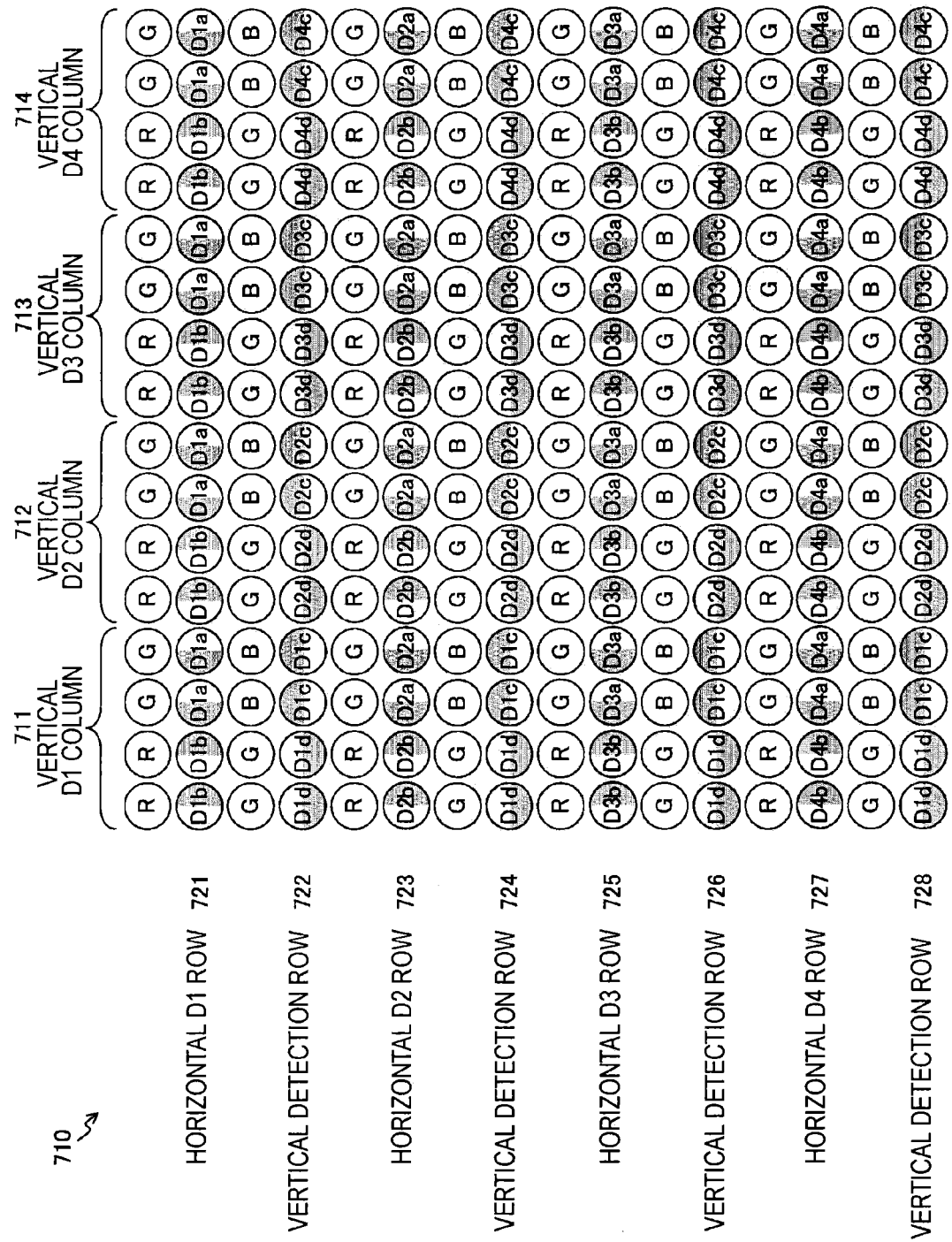
FIG. 11 is a view illustrating an example of an arrangement of light reception elements of a second image sensor in which positions of a pair of phase difference detecting pixels are opposite to those of the first embodiment according to a modified example of the first embodiment of the present invention.

FIG. 11 is a view illustrating an example of an arrangement of light reception elements of a second image sensor in which positions of a pair of phase difference detecting pixels which form a pair are opposite to those of the first embodiment according to a modified example of the first embodiment of the present invention.

FIG. 11 illustrates an area 710 which is an area of light reception elements of 16 rows and 16 columns in the second image sensor in which the positions of the phase difference detection pixels which form a pair are opposite to those in the first embodiment, and which is an area corresponding to the area 210 illustrated in FIG. 3. FIG. 11 illustrates horizontal D1 row 721, horizontal D2, row 723, horizontal D3 row 725 and horizontal D4 row 727 as rows in which light reception elements to be pupil-divided in the reading direction are arranged. Further, a vertical detection row 722, a vertical detection row 724, a vertical detection row 726 and a vertical detection row 728 are illustrated as rows in which light reception elements to be pupil-divided in the vertical direction are arranged. The positions of light reception elements which form pairs in these rows are opposite compared to the rows in which light reception elements to be pupil-divided in the area 210 illustrated in FIG. 3 are arranged. For example, upon comparison between horizontal D1 row 721 and horizontal D1 row 321 (see FIG. 3), the positions of the phase difference detection pixel D1*a* and the phase difference detection pixel D1*b* are opposite. In addition, similar to the rows in which light reception elements to be pupil-divided in the reading direction are arranged, the positions of the light reception elements which form pairs are opposite even in rows in which light reception elements to be pupil-divided in a direction orthogonal to the reading direction.

Thus, even when positions of phase difference detection pixels which form pairs are different from those of the first embodiment of the present invention, it is possible to fix the rate of phase difference detection pixels neighbor to the image generation pixels similar to the first embodiment of the present invention.

FIG. 12 is a view illustrating an arrangement of light reception elements of the second image sensor in which only phase difference detection pixels to be pupil-divided in the reading direction are arranged in a row of the phase difference detection pixels according to the modified example of the first embodiment of the present invention.

FIG. 12 illustrates an area 730 which is an area of light reception elements of 16 rows and 16 columns in the second image sensor in which only phase difference detection pixels to be pupil-divided in the reading direction are arranged in the rows of the phase difference detection pixels, and which is an area corresponding to the area 210 illustrated in FIG. 3. FIG. 12 illustrates horizontal D1 row 731, horizontal D2 row 732, horizontal D3 row 733, horizontal D4 row 734, horizontal D5 row 735, horizontal D6 row 736, horizontal D7 row 737 and horizontal D8 row 738 as rows in which light reception elements to be pupil-divided in the reading direction are arranged. Horizontal D5 row 735 to horizontal D8 row 738 are rows in which phase difference detection pixels meeting positions of exit pupils different from horizontal D1 row 731 to horizontal D4 row 734. Further, in rows of phase difference detection pixels in the area 730, phase difference detection pixels which form pairs are arranged.

Thus, by arranging only phase difference pixels to be pupil-divided in the reading direction such that phase difference detection pixels which form pairs are arranged, it is possible to support more positions of exit pupils than the second image sensor 200 according to the first embodiment.

Figure 13:
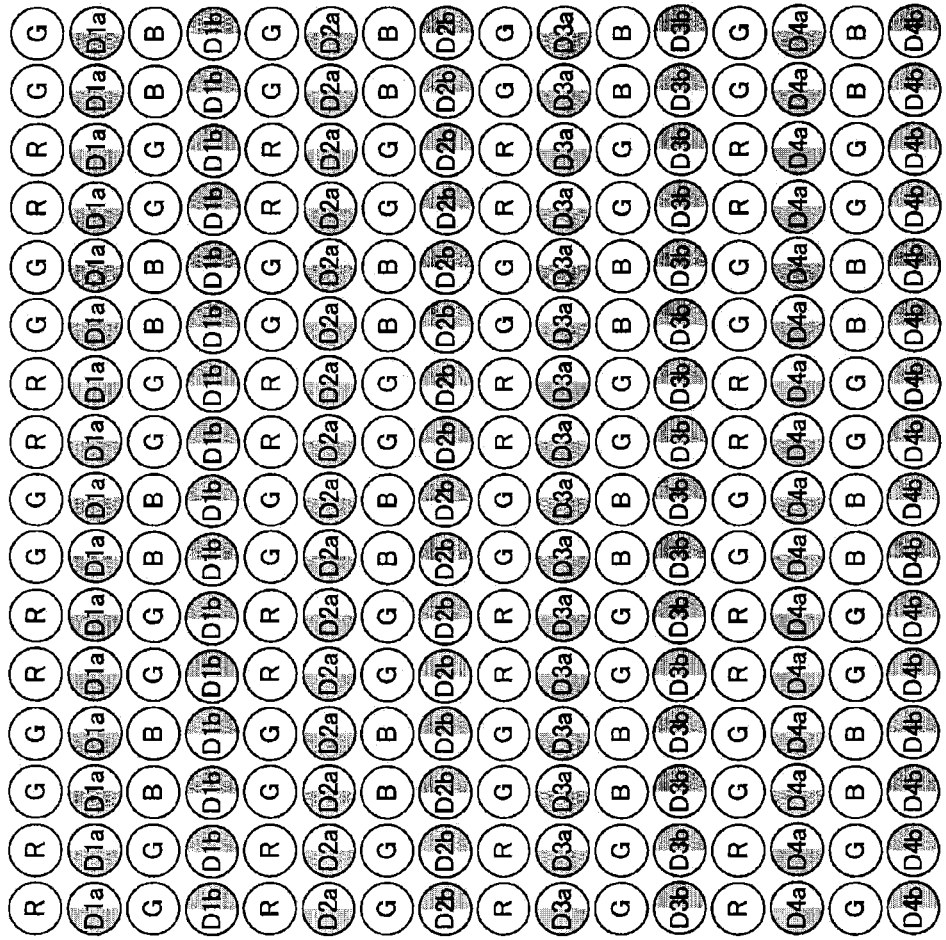
FIG. 13 is view illustrating an example of an arrangement of the light reception elements of the second image sensor which is different from FIG. 12 and in which only phase difference detecting pixels to be pupil-divided in the reading direction are arranged in a row of the phase difference detecting pixels according to the modified example of the first embodiment of the present invention.

FIG. 13 is view illustrating an example of an arrangement of the second image sensor which is different from FIG. 12 and in which only phase difference detecting pixels to be pupil-divided in the reading direction are arranged in a row of the phase difference detecting pixels according to the modified example of the first embodiment of the present invention.

FIG. 13 illustrates an area 740 which is an area of light reception elements of 16 rows and 16 columns in the second image sensor in which only phase difference detection pixels to be pupil-divided in the reading direction are arranged in the rows of the phase difference detection pixels, and which has a different pattern from the area 730 illustrated in FIG. 12. FIG. 13 illustrates horizontal D1a row 741, horizontal D1b row 742, horizontal D2a row 743, horizontal D2b row 744, horizontal D3a row 745, horizontal D3b row 746, horizontal D4a row 747 and horizontal D4b row 748 as rows in which light reception elements to be pupil-divided in the reading direction are arranged. Horizontal D1a row 741 is a row in which only phase difference detection pixels D1a are arranged and horizontal D1b row 742 is a row in which only the phase difference detection pixels D1b are arranged. Similarly, horizontal D2a row 743 to horizontal D4b row 748 are rows in which only phase difference detection image D2a to D4b are arranged.

By this means, by arranging only phase difference detection pixels to be pupil-divided in the reading direction such that the phase difference detection pixels which form pairs are provided in separate rows, it is possible to narrow a pitch between phase difference detection pixels which receive light pupil-divided in the identical direction and improve precision to detect the phase difference.

In addition, there are cases where only phase difference detection pixels to be pupil-divided in the reading direction as illustrated in FIGS. 12 and 13 are arranged in rows of phase difference detection pixels and, in addition, there are cases where only phase difference detection pixels to be pupil-divided in a direction orthogonal to the reading direction are arranged in rows of phase difference detection pixels.

Figure 14:
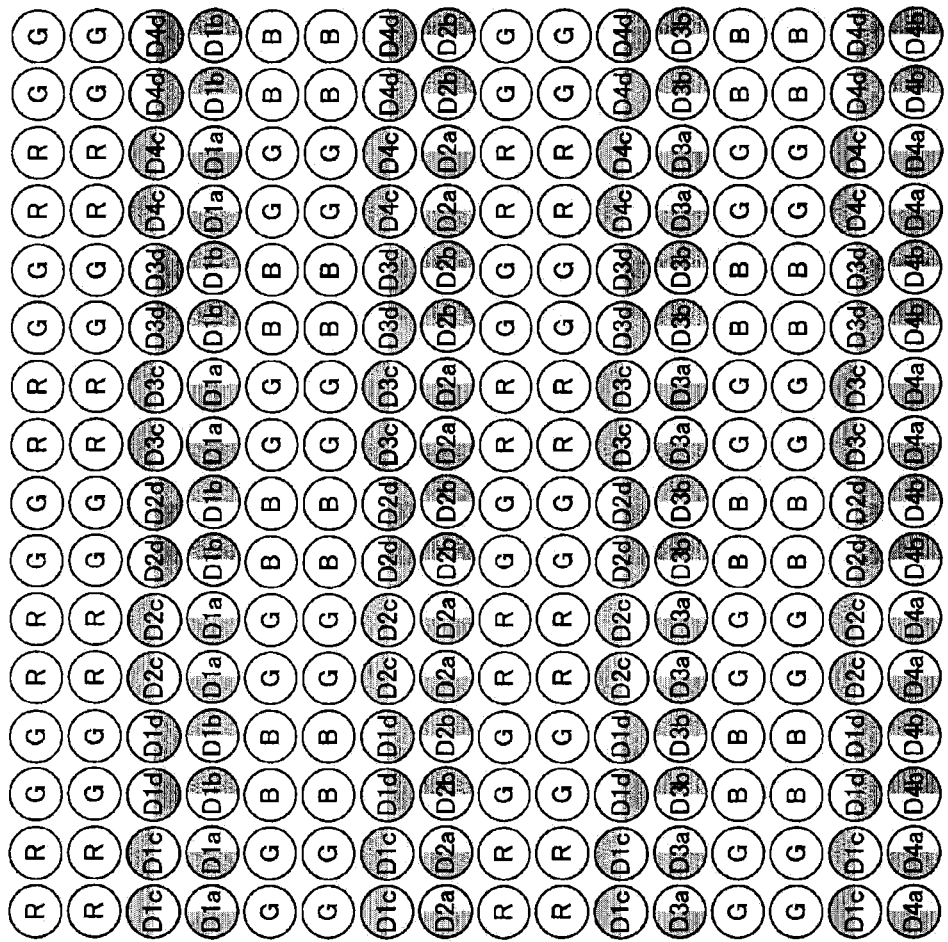
FIG. 14 is a view illustrating an example of an arrangement of the light reception elements of the second image sensor in which rows of phase difference detecting pixels and rows of image generating pixels are alternately arranged every two other rows according to the modified example of the first embodiment of the present invention.

FIG. 14 is a view illustrating an example of an arrangement of light reception elements of the second image sensor in which a row of phase difference detecting pixels and a row of image generating pixels are alternately arranged every two other rows.

FIG. 14 illustrates an area 750 which is an area of light reception elements of 16 rows and 16 columns in the second image sensor in which rows of phase difference detection pixels and rows of image generation pixels are alternately arranged every two other rows, and which is an area corresponding to the area 210 illustrated in FIG. 3. FIG. 14 illustrates that two rows in which image generation pixels are arranged and two rows in which phase difference detection pixels are arranged are alternately arranged. In case of this arrangement, light reception elements of image generation pixels are neighbor to light reception elements of three phase difference detection pixels. That is, even when rows of image generation pixels and rows of phase difference detection pixels are alternately arranged as described in the first embodiment, it is possible to fix a rate of phase difference detection pixels neighbor to image generation pixels.

In addition, even when rows of image generation pixels are arranged every two other rows or rows of phase difference detection pixels are arranged every three other row, it is possible to fix the rate of phase difference detection pixels neighbor to image generation pixels. In this case, by performing correction processing such that the aspect ratio is the same as the still image when a captured image is generated, it is possible to generate a live view image of the still image.

As illustrated in FIGS. 11 to 14, according to the arrangement other than the arrangement in the first embodiment of the present invention, it is possible to fix the rate of phase difference detection pixels neighbor to image generation pixels.

In addition, although the first embodiment and the modified example of the present invention have been described where phase difference detection pixels and image generation pixels each have two light reception elements, the present invention is by no means limited to this. When, for example, data is transferred fast to such an extent that the number of pixels does not need to be reduced to half, phase difference detection pixels and image generation pixels which each have one light reception element per pixel such that the rate of phase difference detection pixels neighbor to image generation pixels is fixed. Further, by creating a light reception element of a rectangular shape (having the size corresponding to two light reception elements according to the first embodiment) when a second image is made, it may be possible to form one pixel using one light reception element.

In addition, although the first embodiment and the modified example of the present invention assume that the second image sensor 200 is a CMOS sensor, the present invention is by no means limited to this and a CCD (Charge Coupled Device) sensor may be used in some cases. Further, although using an image generated from a signal of the second image sensor 200 is assumed as a live view image, the present invention is by no means limited to this, and, for example, movies may be stored in a memory unit 181 in some cases.

In addition, the embodiment of the present invention is an exemplary embodiment for embodying the present invention, the matters according to the embodiment of the present invention and matters specifying the inventions in the claims have correspondences as clearly described in the embodiment of the present invention. Similarly, the matters specifying the inventions in the claims and the matters in the embodiment of the present invention assigned the same names as the matters specifying the inventions each have correspondences. However, the present invention is by no means limited to the embodiment, and can be embodied by variously modifying the embodiment within a scope which does not deviate from the spirit of the present invention.

Further, processing process described in the embodiment of the present invention may be understood as a method including a series of these processes, a program for causing a computer to execute a series of these processes or a recording medium which records this program. For this recording medium, for example, CDs (Compact Disk), MDs (Mini Disk), DVDs (Digital Versatile Disk), memory cards, Blu-ray Discs (registered trademark) can be used.

Reference Signs List
100 Imaging device
110 Lens unit
111 Zoom lens
112 Diaphragm
113 Focus lens
120 Operation reception unit
130 Control unit
140 First image sensor
150 First signal processing unit
160 Pellicle mirror
170 Second signal processing unit
181 Memory unit
182 Display unit
183 Focus adjustment decision unit
184 Drive unit
200 Second image sensor

The invention claimed is:

1. An image capture element comprising:
a plurality of phase difference detection pixels which generate signals for performing adjusted focus decision by way of phase difference detection; and
a plurality of image generation pixels which generate signals for generating an image,
wherein a first pixel group formed by arranging a part of phase difference detection pixels of the plurality of phase difference detection pixels in a specific direction and a second pixel group formed by arranging a part of image generation pixels of the plurality of image generation pixels in the specific direction are alternately arranged in an orthogonal direction orthogonal to the specific direction,
wherein the first pixel group comprises a first line formed by arranging in the specific direction the phase difference detection pixels to be pupil-divided in the specific direction and a second line formed by arranging in the specific direction the phase difference detection pixels to be pupil-divided in the orthogonal direction, and
wherein the first line and the second line are alternately arranged across the second pixel group.

2. The image capture element according to claim 1, wherein each of the plurality of image generation pixels has a fixed ratio of the phase difference detection pixels and the image generation pixels for each neighboring pixel in an area of the image capture element which receives subject light.

3. The image capture element according to claim 1, wherein
the first pixel group comprises a plurality of phase difference detection pixels forming one or a plurality of lines, and
the second pixel group comprises a plurality of image generation pixels forming one or two lines.

4. The image capture element according to claim 1, wherein the specific direction is a reading direction when data generated by the phase difference detection pixels and the image generation pixels is read from the phase difference detection pixels and the image generation pixels.

5. The image capture element according to claim 1, wherein
the first pixel group comprises a plurality of phase difference detection pixels forming one line,
the second pixel group comprises a plurality of image generation pixels forming one line, and
two continuous image generation pixels of the plurality of image generation pixels which comprise color filters of an identical property and are arranged in the specific direction form a pair of image generation pixels, and each pixel is arranged using the pair of image generation pixels as pixel units.

6. The image capture element according to claim 5, wherein the plurality of image generation pixels is arranged in Bayer alignment in the pixel units in the image capture element.

7. The image capture element according to claim 1, wherein two phase difference detection pixels of the plurality of phase difference detection pixels which perform pupil division in an identical direction and receive lights divided in one way of the identical direction form a pair of phase difference detection pixels as two continuous phase difference detection pixels arranged in the specific direction, and each pixel is arranged using the pair of the phase difference detection pixels as pixel units.

8. The image capture element according to claim 1, wherein two continuous light reception elements of light reception elements of the plurality of image generation pixels which comprise color filters of an identical property and which are arranged in the specific direction form a pair of light reception elements, and each pixel is arranged using two pixels related to the pair of light reception elements as pixel units.

9. The image capture element according to claim 1, wherein two light reception elements of light reception elements of the plurality of phase difference detection pixels which perform pupil division in an identical direction and receive light divided in one way of the identical direction form a pair of light reception elements, and each element is arranged using two pixels related to the pair of light reception elements as pixel units.

10. The image capture element according to claim 1, wherein
the phase difference detection pixels comprise a first plurality of phase difference detection pixels corresponding to a plurality of exit pupils provided at different positions in an optical axis direction, and
the first line is formed by arranging phase difference detection pixels of the first plurality of phase difference detection pixels comprising the exit pupils provided at an identical position.

11. The image capture element according to claim 1, wherein
the phase difference detection pixels comprise a first plurality of phase difference detection pixels corresponding to a plurality of exit pupils provided at different positions in an axial direction, and
the second line is formed by arranging phase difference detection pixels of the first plurality of phase difference detection pixels comprising the exit pupils provided at an identical position, at a position identical to a position in the specific direction.

12. An image capture element comprising:
a plurality of phase difference detection pixels which generate signals for performing adjusted focus decision by way of phase difference detection; and
a plurality of image generation pixels which generate signals for generating an image,
wherein each of the plurality of image generation pixels has a fixed ratio of phase difference detection pixels of the plurality of phase difference detection pixels and image generation pixels of the plurality of image generation pixels for each neighboring pixel in an area of the image capture element which receives subject light, wherein a first pixel group which is formed by arranging a part of the phase difference detection pixels in a specific direction, and a second pixel group which is formed by arranging a part of the image generation pixels in the specific direction, wherein the first pixel group and the second pixel group are alternately arranged in an orthogonal direction orthogonal to the specific direction, wherein the first pixel group comprises a first line formed by arranging in the specific direction the phase difference detection pixels to be pupil-divided in the specific direction and a second line formed by arranging in the specific direction the phase difference detection pixels to be pupil-divided in the orthogonal direction, and wherein the first line and the second line are alternately arranged across the second pixel group.

13. An imaging device comprising:

an image capture element which comprises a plurality of phase difference detection pixels which generate signals for performing adjusted focus decision by phase difference detection and a plurality of image generation pixels which generate signals for generating an image, wherein a first pixel group which is formed by arranging a part of phase difference detection pixels of the plurality of phase difference detection pixels in a specific direction, and a second pixel group which is formed by arranging a part of image generation pixels of the plurality of image generation pixels in the specific direction, wherein the first pixel group and the second pixel group are alternately arranged in an orthogonal direction orthogonal to the specific direction, wherein the first pixel group comprises a first line formed by arranging in the specific direction the phase difference detection pixels to be pupil-divided in the specific direction and a second line formed by arranging in the specific direction the phase difference detection pixels to be pupil-divided in the orthogonal direction, and wherein the first line and the second line are alternately arranged across the second pixel group;

a focus adjustment decision unit which performs the adjusted focus decision by way of the phase difference detection based on the signals generated by the plurality of phase difference detection pixels; and an image generation unit which generates the image based on the signals generated by the plurality of image generation pixels.

* * * * *